US012518947B2

(12) United States Patent
Yamazawa et al.

(10) Patent No.: US 12,518,947 B2
(45) Date of Patent: Jan. 6, 2026

(54) PLASMA PROCESSING APPARATUS AND PLASMA PROCESSING COIL

(71) Applicant: TOKYO ELECTRON LIMITED, Tokyo (JP)

(72) Inventors: Yohei Yamazawa, Miyagi (JP); Takehisa Saito, Miyagi (JP); Naoki Fujiwara, Miyagi (JP); Kaori Fujiwara, Miyagi (JP); Daisuke Kurashina, Miyagi (JP); Yuki Hosaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 900 days.

(21) Appl. No.: 17/495,760

(22) Filed: Oct. 6, 2021

(65) Prior Publication Data

US 2022/0108871 A1 Apr. 7, 2022

(30) Foreign Application Priority Data

Oct. 6, 2020 (JP) ................................ 2020-168909
Jul. 30, 2021 (JP) ................................ 2021-125392

(51) Int. Cl.
*H01J 37/32* (2006.01)

(52) U.S. Cl.
CPC ..... *H01J 37/3211* (2013.01); *H01J 37/32174* (2013.01)

(58) Field of Classification Search
CPC ... H01J 37/321–32119; H01J 37/32174; H01J 37/3244; H01Q 7/00
See application file for complete search history.

(56) References Cited

U.S. PATENT DOCUMENTS 6,164,241 A * 12/2000 Chen ..................... H01J 37/321 427/569
6,238,588 B1 * 5/2001 Collins ............. H01L 21/02063 438/719
6,744,213 B2 * 6/2004 Wilcoxson ............ H01J 37/321 315/111.41
9,552,965 B2 * 1/2017 Song .................. H01J 37/32119
2004/0085246 A1 * 5/2004 Howald ................. H01Q 21/29 343/742
2010/0066251 A1 * 3/2010 Nakagami ......... H01J 37/32174 315/111.51
2019/0098740 A1 * 3/2019 Yamazawa ........ H01J 37/32174

FOREIGN PATENT DOCUMENTS

JP 2019-067503 A 4/2019
WO 2008/065744 A1 6/2008

* cited by examiner

*Primary Examiner* — Benjamin Kendall
(74) *Attorney, Agent, or Firm* — XSENSUS LLP

(57) ABSTRACT

A plasma processing apparatus includes: a main coil disposed on or above a plasma processing chamber; and a sub-coil assembly disposed radially inside or outside the main coil. The sub-coil assembly includes a first spiral coil and a second spiral coil. Each turn of the first spiral coil and each turn of the second spiral coil are alternately arranged in a vertical direction. A first upper terminal of the first spiral coil is connected to a ground potential via one or more capacitors, and a first lower terminal of the first spiral coil is connected to the ground potential. A second upper terminal of the second spiral coil is connected to the ground potential via one or more capacitors or one or more other capacitors, and a second lower terminal of the second spiral coil is connected to the ground potential.

19 Claims, 17 Drawing Sheets

PLASMA PROCESSING APPARATUS AND PLASMA PROCESSING COIL

CROSS-REFERENCE TO RELATED APPLICATION

This application is based on and claims priority from Japanese Patent Application Nos. 2020-168909 and 2021-125392, filed on Oct. 6, 2020 and Jul. 30, 2021, respectively, with the Japan Patent Office, the disclosures of which are incorporated herein in their entireties by reference.

TECHNICAL FIELD

The present disclosure relates to a plasma processing apparatus and a plasma processing coil.

BACKGROUND

Japanese Patent Laid-Open Publication No. 2019-067503 discloses a plasma processing apparatus including an antenna that generates plasma of a processing gas in a chamber by supplying radio-frequency to the chamber, and a power supply that supplies a radio-frequency power to the antenna. The antenna has an outer coil and an inner coil that is inductively coupled to the outer coil.

SUMMARY

According to an aspect of the present disclosure, a plasma processing apparatus includes: a plasma processing chamber; a main coil disposed on or above the plasma processing chamber; a sub-coil assembly disposed radially inside or outside the main coil; and an RF power supply configured to supply an RF power to the main coil. The sub-coil assembly includes a first spiral coil having one or more turns and a second spiral coil having one or more turns. Each turn of the first spiral coil and each turn of the second spiral coil are alternately arranged in a vertical direction. The first spiral coil has a first upper terminal at an upper end of the first spiral coil and a first lower terminal at a lower end of the first spiral coil, the first upper terminal is connected to a ground potential via one or more capacitors, and the first lower terminal is connected to the ground potential. The second spiral coil has a second upper terminal at an upper end of the second spiral coil and a second lower terminal at a lower end of the second spiral coil, the second upper terminal is connected to the ground potential via the one or more capacitors, or one or more other capacitors, and the second lower terminal is connected to the ground potential.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
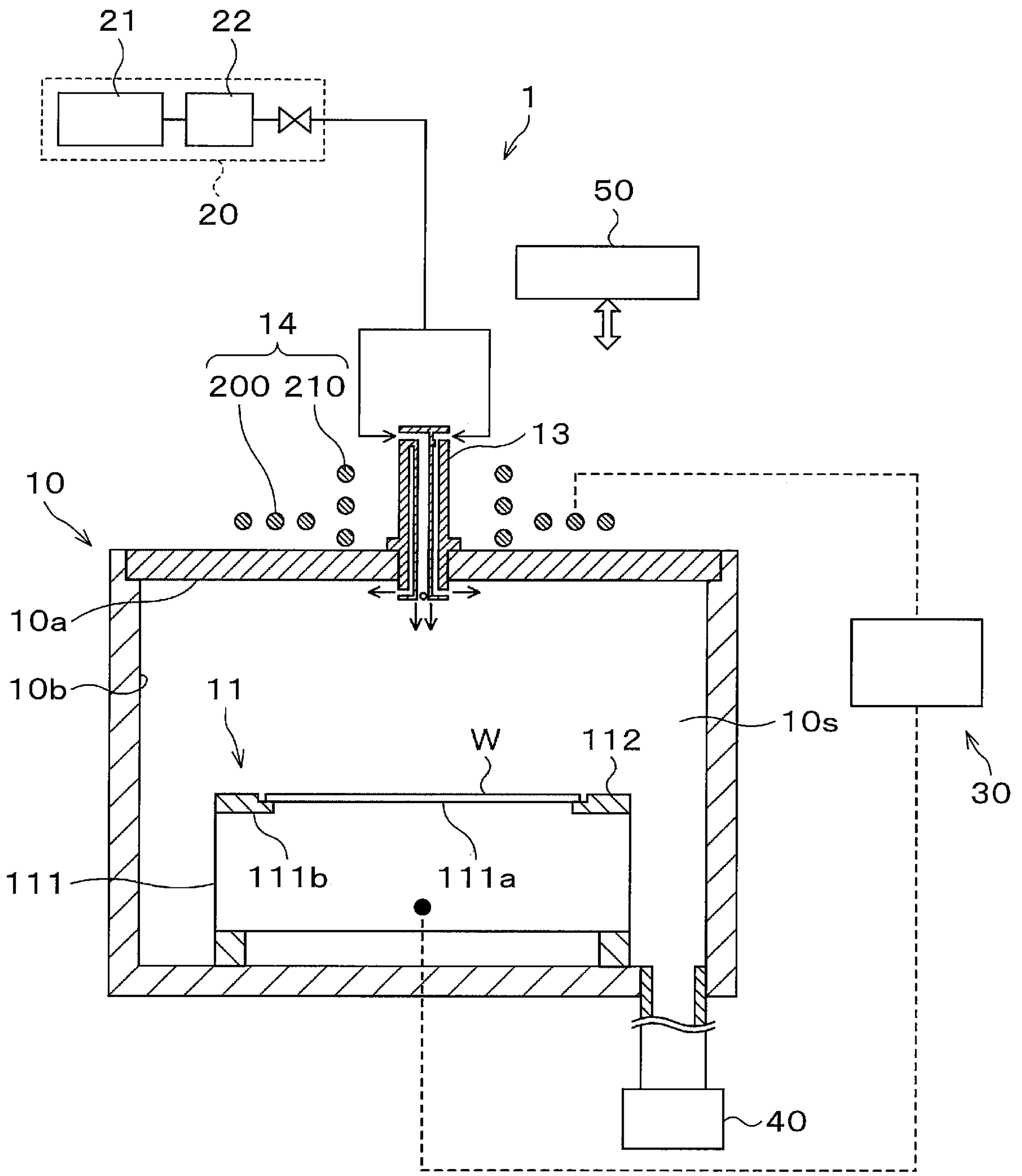
FIG. 1 is a cross-sectional view illustrating an outline of the configuration of a plasma processing system.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In a semiconductor device manufacturing process, a semiconductor wafer (hereinafter, referred to as a "wafer") is subjected to plasma processing such as etching and film formation. In the plasma processing, plasma is generated by exciting a processing gas, and the wafer is processed by the plasma.

As for one of plasma sources, for example, inductively coupled plasma (ICP) may be used. The plasma processing apparatus disclosed in Japanese Patent Laid-Open Publication No. 2019-067503 is an inductively coupled plasma processing apparatus, and includes an antenna having an outer coil and an inner coil.

The outer coil is formed in a substantially circular spiral shape for two or more turns, and is arranged above a dielectric window so that the central axis of the outer shape of the outer coil coincides with the Z axis. The outer coil is configured such that both ends of a line constituting the outer coil are opened, power is supplied from a power supply to or near the midpoint of the line, and the outer coil is grounded near the midpoint to resonate at half the wavelength of the radio-frequency power supplied from the power supply.

The inner coil is formed in a substantially circular ring shape and is arranged above the dielectric window so that the central axis of the inner coil coincides with the Z axis. In the inner coil, both ends of the line constituting the inner coil are connected via a capacitor, and are inductively coupled to the outer coil.

The inventors of the present disclosure recognized that when the antenna disclosed in Japanese Patent Laid-Open Publication No. 2019-067503 is used, the end point electric field of a resonance mechanism becomes higher. The end point electric field affects the lower surface of the dielectric window, that is, the density distribution of plasma in the chamber (hereinafter, referred to as a "plasma distribution"), which may cause an etch rate imbalance. Therefore, it is desirable to reduce the electric field strength required for plasma ignition from the viewpoint of uniform plasma generation by the induced magnetic field.

Meanwhile, an antenna assembly including a main coil and a sub-coil as disclosed in Japanese Patent Laid-Open Publication No. 2019-067503 is required to have a relatively high etch rate and relatively high controllability. This requirement may be met by increasing the output of RF power. While increasing the output of RF power contributes to an increase in the plasma density in the chamber, it is necessary to increase the current flowing through the sub-coil via the main coil in order to make the plasma density uniform. In this case, since the temperature of the sub-coil rises, it is necessary to design the sub-coil in consideration of high heat resistance. Therefore, it is necessary to design a coil in which heat generation is suppressed and to maintain the uniformity of plasma distribution when drawn into the center.

The technique according to the present disclosure improves the uniformity of plasma distribution with respect to a substrate while reducing the electric field strength when performing plasma processing. Hereinafter, the plasma processing apparatus according to the present embodiment will be described with reference to the accompanying drawings. Also, in the present specification and drawings, components having substantially the same functional configurations will be denoted by the same symbols, and the descriptions thereof will be omitted.

<Configuration of Plasma Processing Apparatus>

First, the configuration of a plasma processing system according to an embodiment will be described. FIG. 1 is a cross-sectional view illustrating an outline of the configuration of the plasma processing system. The plasma processing system includes a plasma processing apparatus 1 and a control device 50. Further, the plasma processing apparatus 1 of the present embodiment is a plasma processing apparatus using inductively coupled plasma.

The plasma processing apparatus 1 includes a plasma processing chamber 10, a gas supply 20, a power supply 30, and an exhaust system 40. The plasma processing chamber 10 includes a dielectric window 10*a* and a side wall 10*b*, and accommodates a substrate (wafer) W. The dielectric window 10*a* constitutes an upper portion of the plasma processing chamber 10 and is provided in an upper opening of the side wall 10*b*. The dielectric window 10*a* and the side wall 10*b* define a plasma processing space 10*s* in the plasma processing chamber 10.

Further, the plasma processing apparatus 1 includes a substrate (wafer) support 11, a gas introduction unit 13, and an antenna 14. The substrate support 11 is disposed within the plasma processing space 10*s*. The antenna 14 is disposed in the upper portion of or above the plasma processing chamber 10 (dielectric window 10*a*). The configuration of the antenna 14 will be described later.

The substrate support 11 includes a main body 111 and an annular member (edge ring) 112. The main body 111 has a central region (substrate support surface) 111*a* for supporting the substrate (wafer) W and an annular region (edge ring support surface) 111*b* for supporting the annular member 112. The annular region 111*b* of the main body 111 surrounds the central region 111*a* of the main body 111. The substrate W is disposed on the central region 111*a* of the main body 111, and the annular member 112 is disposed on the annular region 111*b* of the main body 111 so as to surround the substrate W on the central region 111*a* of the main body 111. In the embodiment, the main body 111 includes an electrostatic chuck and a conductive member. The conductive member is disposed below the electrostatic chuck. The conductive member functions as an RF electrode by supplying a radio-frequency (RF) power, and the upper surface of the electrostatic chuck functions as a substrate support surface 111*a*. Although not illustrated, in the embodiment, the substrate support 11 may include a temperature control module configured to adjust at least one of the electrostatic chuck and the substrate W to a target temperature. The temperature control module may include a heater, a flow path, or a combination thereof. A temperature control fluid such as a coolant or a heat transfer gas flows through the flow path.

The gas introduction unit 13 is configured to supply (introduce) at least one processing gas from the gas supply 20 into the plasma processing space 10*s*. In the embodiment, the gas introduction unit 13 may include a central gas injector (CGI) that is disposed above the substrate support 11 and attached to a central opening formed in the dielectric window 10*a*. Alternatively or additionally, the gas introduction unit 13 may include one or more side gas injectors (SGIs) attached to one or more openings formed in the side wall 10*b*.

The gas supply 20 may include at least one gas source 21 and at least one flow rate controller 22. In the embodiment, the gas supply 20 is configured to supply one or more processing gases from the corresponding gas sources 21 to the gas introduction unit 13 via the corresponding flow rate controllers 22. Each flow rate controller 22 may include, for example, a mass flow controller or a pressure-controlled flow rate controller. Further, the gas supply 20 may include one or more flow rate modulation devices that modulate or pulse the flow rate of one or more processing gases.

The power supply 30 includes an RF power supply. The RF power supply is configured to supply at least one RF signal (an RF power, for example, a source RF signal and a bias RF signal) to the conductive member of the substrate support 11 and the antenna 14. As a result, plasma is generated from one or more processing gases supplied to the plasma processing space 10*s*.

In the embodiment, the RF power supply includes a first RF generator and a second RF generator. The first RF generator is configured to be connected to a main coil 200 (to be described later) of the antenna 14 and generate a source RF signal (source RF power) for plasma generation. In the embodiment, the source RF signal has frequencies in the range of 27 MHz to 100 MHz. The generated source RF signal is supplied to the main coil 200 of the antenna 14. The second RF generator is configured to be connected to the conductive member of the substrate support 11 and generate a bias RF signal (bias RF power). The generated bias RF signal is supplied to the conductive member of the substrate support 11. In the embodiment, the bias RF signal has a frequency lower than that of the source RF signal. In the embodiment, the bias RF signal has frequencies in the range of 100 kHz to 13.56 MHz. Further, in various embodiments, the amplitude of at least one RF signal among the source RF signal and the bias RF signal may be pulsed or modulated. The amplitude modulation may include pulsing the amplitude of the RF signal between the on and off states, or between two or more different on states.

The power supply 30 may include a DC power supply. The DC power supply includes a bias DC generator. In the embodiment, the bias DC generator is configured to be connected to the conductive member of the substrate support 11 and generate a bias DC signal. The generated bias DC signal is applied to the conductive member of the substrate support 11. In the embodiment, a bias DC signal may be applied to another electrode, such as an electrode in an electrostatic chuck. In the embodiment, the bias DC signal may be pulsed. Further, the bias DC generator may be provided in addition to the RF power supply, or may be provided in place of the second RF generator.

The exhaust system 40 may be connected to, for example, an exhaust port 10*e* (gas outlet) formed at the bottom of the plasma processing chamber 10. The exhaust system 40 may include a pressure valve and a vacuum pump. The vacuum pump may include a turbo molecular pump, a roughing pump, or a combination thereof.

The control device 50 processes computer-executable instructions that cause the plasma processing apparatus 1 to perform the various steps described in the present disclosure. The control device 50 may be configured to control each element of the plasma processing apparatus 1 to perform the various steps described herein. In the embodiment, a part or entirety of the control device 50 may be included in the plasma processing apparatus 1. The control device 50 may include, for example, a computer. The computer may include, for example, a processing unit (central processing unit (CPU)), a storage unit, and a communication interface. The processing unit 511 may be configured to perform various control operations based on the program stored in the storage unit. The storage unit may include a random access memory (RAM), a read only memory (ROM), a hard disk drive (HDD), a solid state drive (SSD), or a combination thereof. The communication interface may communicate with the plasma processing apparatus 1 via a communication line such as a local area network (LAN).

<Configuration of Antenna>

Figure 2:
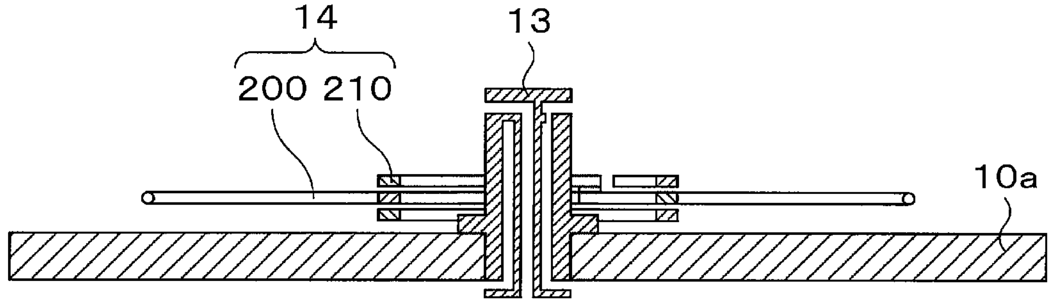
FIG. 2 is a cross-sectional view illustrating an outline of an antenna configuration.
Figure 3:
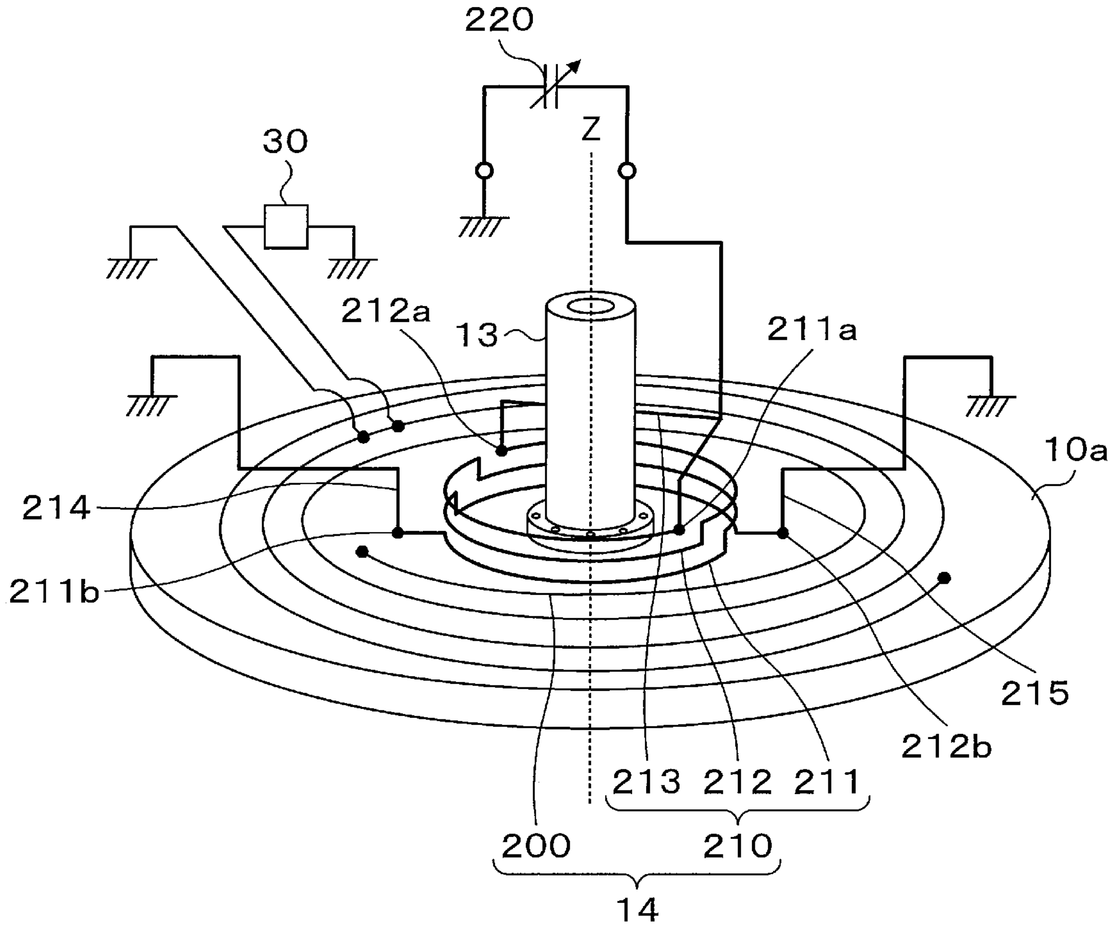
FIG. 3 is a perspective view schematically illustrating the outline of the antenna configuration.

Next, the configuration of the antenna 14 for plasma generation will be described. FIG. 2 is a cross-sectional view illustrating an outline of an antenna configuration. FIG. 3 is a perspective view schematically illustrating the outline of the antenna configuration.

As illustrated in FIGS. 2 and 3, the antenna 14 is an inductively coupled plasma excitation antenna, and is an antenna assembly having a main coil 200 and a sub-coil assembly 210. The sub-coil assembly 210 is disposed around the gas introduction unit 13 so as to surround the substantially cylindrical gas introduction unit 13, and is provided inside the main coil 200 in the radial direction. That is, the sub-coil assembly 210 is arranged between the gas introduction unit 13 and the main coil 200. The main coil 200 is provided around the gas introduction unit 13 and the main coil 200 so as to surround the gas introduction unit 13 and the main coil 200. The outer shape of the main coil 200 and the outer shape of the sub-coil assembly 210 are each formed in a substantially circular shape in a plan view as described later. The main coil 200 and the sub-coil assembly 210 are arranged so that their outer shapes are concentric.

Further, the main coil 200 and the sub-coil assembly 210 are each supported by a support mechanism (not illustrated) so as to be arranged above the dielectric window 10*a* away from the dielectric window 10*a*. Here, the sub-coil assembly 210 is not limited to being separated from the dielectric window 10*a*. For example, the sub-coil assembly 210 may be in contact with the upper surface of the dielectric window 10*a*.

[Main Coil]

As illustrated in FIG. 3, the main coil 200 is formed in a substantially circular spiral shape for two or more turns, and is arranged so that the central axis of the outer shape of the main coil 200 coincides with the Z axis. Further, the main coil 200 is a flat coil and is disposed above the dielectric window 10*a* so as to be substantially parallel to the surface of the substrate W supported by the central region 111*a*.

Both ends of the line constituting the main coil 200 are open. Further, the first RF generator of the RF power supply is connected to the midpoint of the line constituting the main coil 200 or the vicinity of the midpoint, and the RF power is supplied to the main coil 200 from the first RF generator. The vicinity of the midpoint of the line constituting the main coil 200 is connected to the ground potential and grounded. The main coil 200 is configured to resonate at 212 with respect to the wavelength λ of the RF power supplied from the first RF generator. The voltage generated in the line constituting the main coil 200 is distributed to be the minimum near the midpoint of the line and the maximum at both ends of the line. Further, the current generated in the line constituting the main coil 200 is distributed to be maximum near the midpoint of the line and minimum at both ends of the line. The frequency and power of the first RF generator that supplies the RF power to the main coil 200 may be changed.

[Sub-Coil Assembly]

Figure 4:
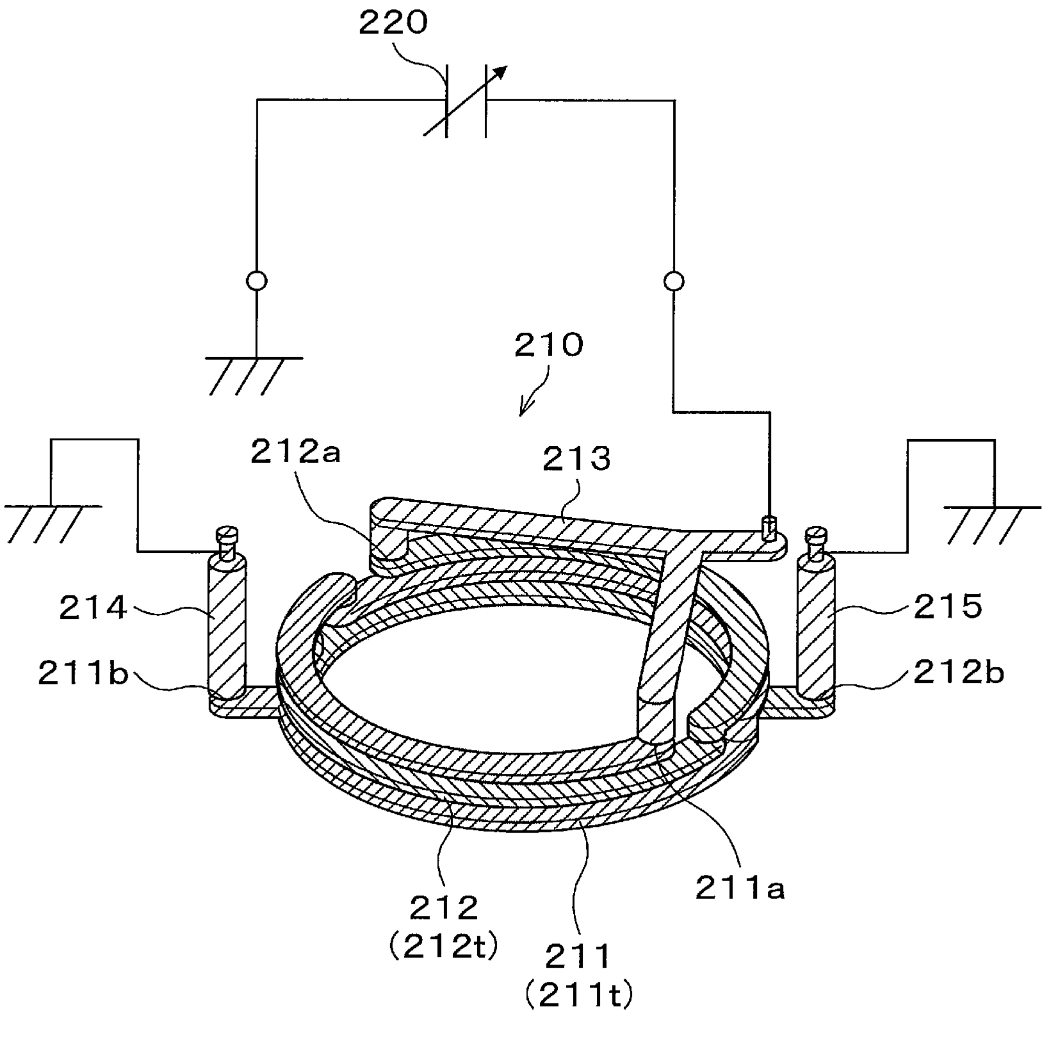
FIG. 4 is a perspective view illustrating an outline of the configuration of a sub-coil assembly.
Figure 5:
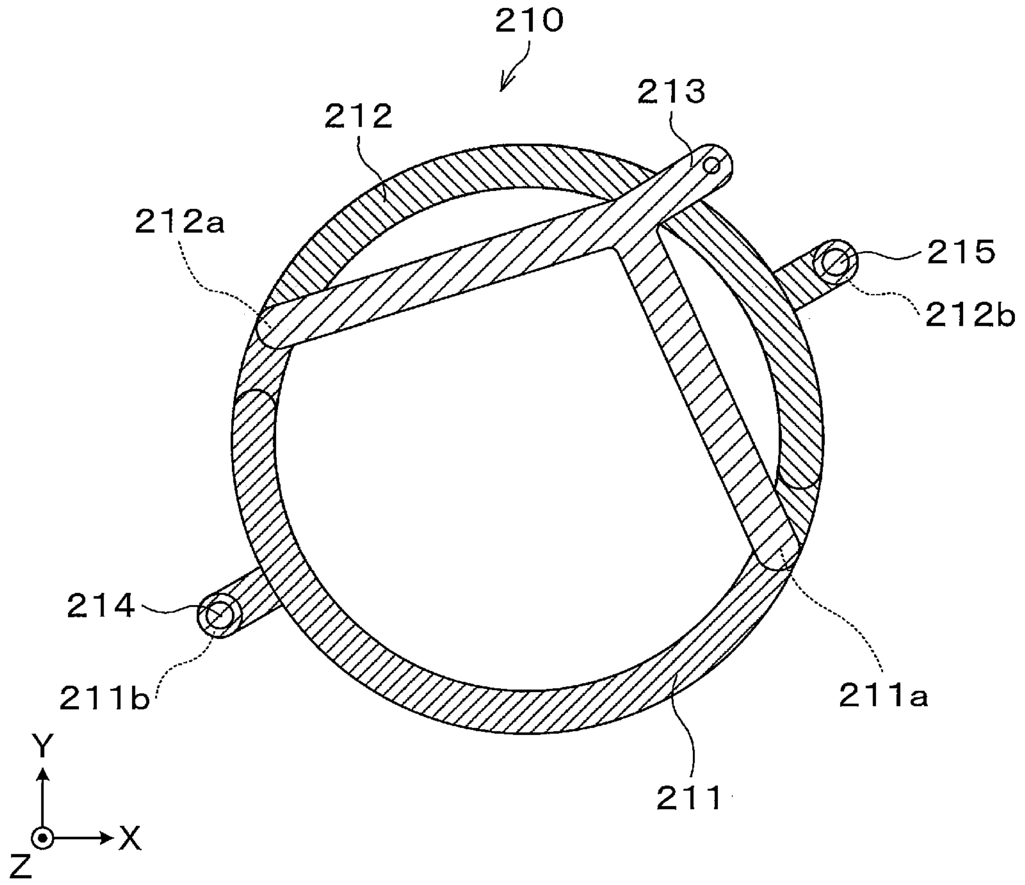
FIG. 5 is a plan view seen from above illustrating an outline of the configuration of the sub-coil assembly.
Figure 6:
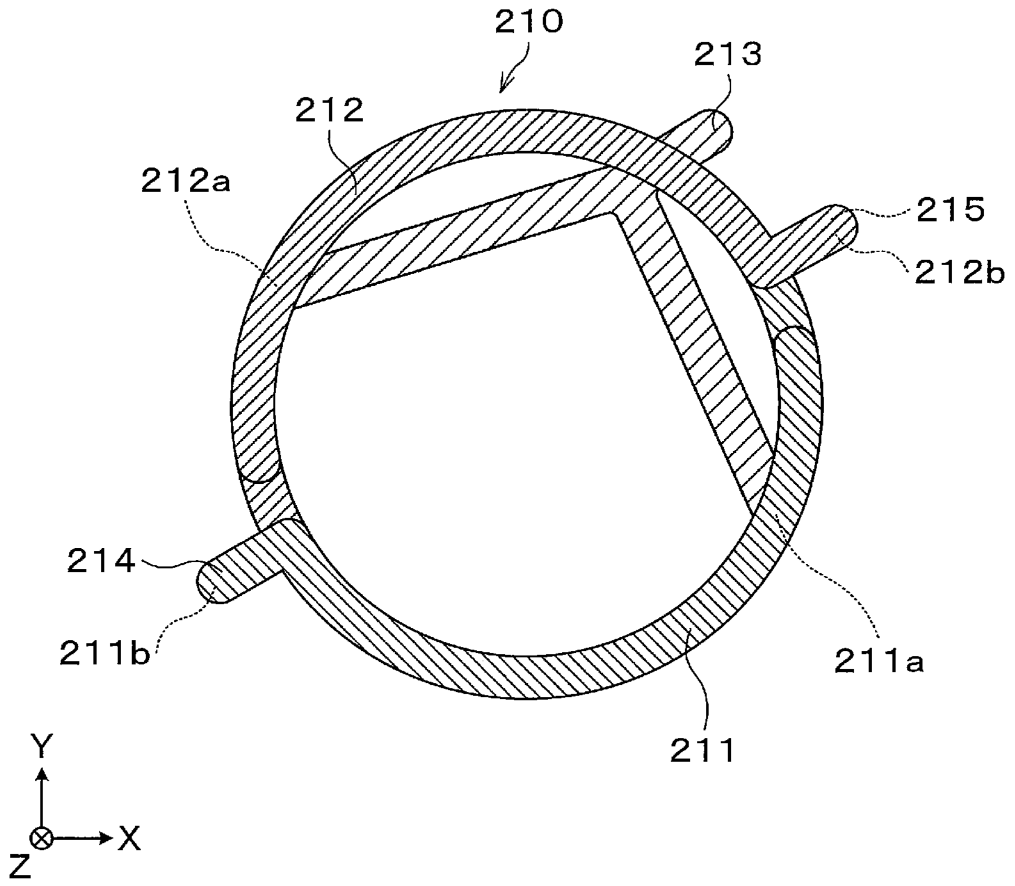
FIG. 6 is a plan view from below illustrating an outline of the configuration of the sub-coil assembly.
Figure 7:
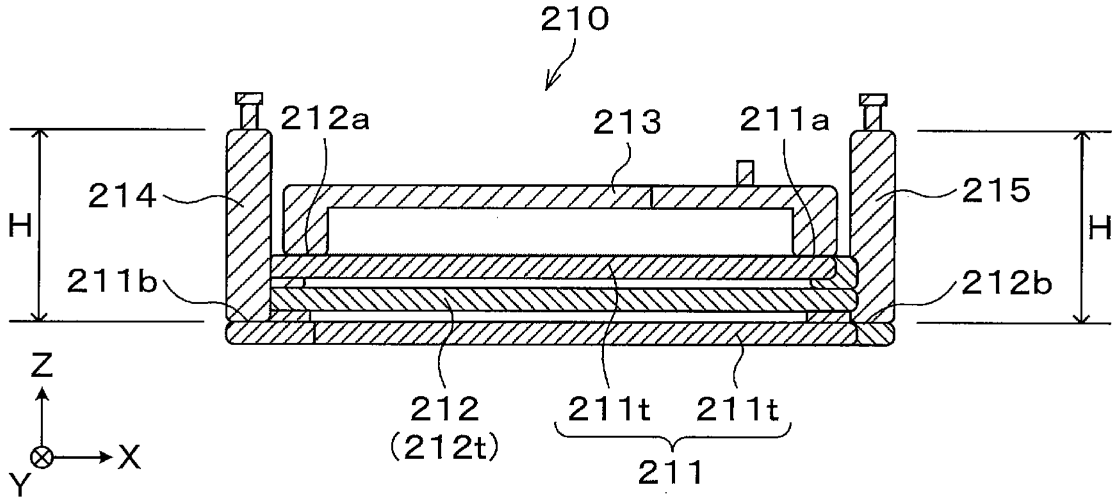
FIG. 7 is a side view illustrating an outline of the configuration of the sub-coil assembly.
Figure 8:
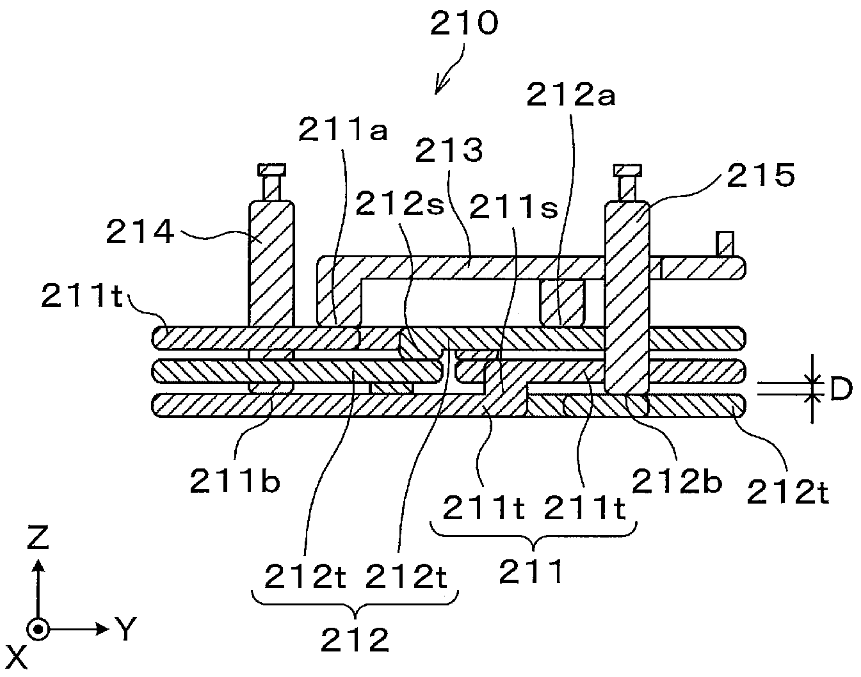
FIG. 8 is a side view illustrating an outline of the configuration of the sub-coil assembly.

FIG. 4 is a perspective view illustrating an outline of the configuration of a sub-coil assembly 210. FIG. 5 is a plan view seen from above illustrating an outline of the configuration of the sub-coil assembly 210. FIG. 6 is a plan view seen from below illustrating an outline of the configuration of the sub-coil assembly 210. FIGS. 7 and 8 are side views illustrating an outline of the configuration of the sub-coil assembly 210.

As illustrated in FIG. 4, the sub-coil assembly 210 includes a first spiral coil 211, a second spiral coil 212, and connecting members 213 to 215. The first spiral coil 211 and the second spiral coil 212 each have a spiral structure. The first spiral coil 211 has one or more turns 211*t* and the second spiral coil 212 has one or more turns 212*t*. Each turn 211*t* of the first spiral coil 211 and each turn 212*t* of the second spiral coil 212 are arranged alternately in the vertical direction in the side view. The central axis of the outer shape of the first spiral coil 211 and the central axis of the outer shape of the second spiral coil 212 each coincide with the Z axis, and the first spiral coil 211 and the second spiral coil 212 are arranged coaxially. The first spiral coil 211 and the second spiral coil 212 are each formed in a substantially circular shape in a plan view. Further, the diameter of each turn 211*t* of the first spiral coil 211 is the same, and the diameter of each turn 212*t* of the second spiral coil 212 is the same. As described above, the sub-coil assembly 210 has a substantially cylindrical double helix structure.

As illustrated in FIGS. 7 and 8, each turn 211*t* of the first spiral coil 211 and each turn 212*t* of the second spiral coil 212 are plate-shaped. For example, each turn 211*t* and each turn 212*t* have a width twice or more with respect to a thickness, respectively. In order to pass a large amount of current through the first spiral coil 211 and the second spiral coil 212, it is preferable that the cross-sectional area of each of the turns 211*t* and 212*t* are large. In the sub-coil assembly 210, the upper portion has a smaller coupling to plasma than the lower portion. Therefore, in order to efficiently perform plasma processing, the height of the sub-coil assembly 210 needs to be low. That is, the thickness of each of the turns 211*t* and 212*t* needs to be small. In such a case, in order to secure the cross-sectional area of each of the turns 211*t* and 212*t* and keep the thickness small, it is preferable that each of the turns 211*t* and 212*t* has a plate shape as in the present embodiment.

As illustrated in FIG. 8, an interval D between the turn 211*t* of the first spiral coil 211 and the turn 212*t* of the second spiral coil 212 adjacent to each other in the vertical direction is 1 mm to 10 mm. Since the interval D is 1 mm or more, it is possible to suppress the dielectric breakdown of adjacent turns 211*t* and 212*t* in a vacuum atmosphere. Further, since the interval D is 10 mm or less, the plasma generation efficiency with respect to the current may be maintained.

In the first spiral coil 211, the connecting member 211*s* connecting the turns 211*t* extends in the vertical direction. In the second spiral coil 212, the connecting member 212*s* connecting the turns 212*t* extends in the vertical direction. In such a case, the first spiral coil 211 and the second spiral coil 212 may be easily manufactured, and the processing accuracy is also improved.

In the illustrated example, the number of turns of the first spiral coil 211 and the second spiral coil 212 is 1.5 turns, but is not limited thereto, and any number of turns of 1 or more may be set. For example, the number of turns of the first spiral coil 211 and the second spiral coil 212 may be two or more.

As illustrated in FIG. 5, the sub-coil assembly 210 has a first upper surface portion formed of the upper surface of the first spiral coil 211 and a second upper surface portion formed of the upper surface of the second spiral coil 212. The first upper surface portion includes a first upper terminal 211*a*, and the second upper surface portion includes a second upper terminal 212*a*. The first upper surface portion and the second upper surface portion are arranged symmetrically with each other. That is, each of the first upper surface portion and the second upper surface portion has a substantially semicircular shape with a central angle of about 180 degrees.

As illustrated in FIG. 6, the sub-coil assembly 210 has a first lower surface portion formed of the lower surface of the first spiral coil 211 and a second lower surface portion formed of the lower surface of the second spiral coil 212. The first lower surface portion includes a first lower terminal 211*a*, and the second lower surface portion includes a second lower terminal 212*a*. The first lower surface portion and the second lower surface portion are arranged symmetrically with each other. That is, each of the first lower surface portion and the second lower surface portion has a substantially semicircular shape with a central angle of about 180 degrees.

As illustrated in FIG. 4, the first spiral coil 211 has a first upper terminal 211*a* at the upper end and a first lower terminal 211*b* at the lower end. The second spiral coil 212 has a second upper terminal 212*a* at the upper end and a second lower terminal 212*b* at the lower end. The first upper terminal 211*a* and the second upper terminal 212*a* are arranged at a symmetrical position with respect to the center of the sub-coil assembly 210, that is, at a position where the central angle of the adjacent upper terminals is about 180 degrees. The first lower terminal 211*b* and the second lower terminal 212*b* are arranged at a symmetrical position with respect to the center of the sub-coil assembly 210, that is, at a position where the central angle of the adjacent upper terminals is about 180 degrees.

The first upper terminal 211*a* and the second upper terminal 212*a* are connected by a connecting member 213 which is a first conductive member. The connecting member 213 is formed in a substantially Y shape in a plan view. The connecting member 213 is connected to the ground potential via one or more capacitors 220 and is grounded. That is, the first upper terminal 211*a* and the second upper terminal 212*a* are connected to the ground potential via a common capacitor 220. One or more capacitors 220 include a variable capacitor. One or more capacitors 220 are not limited to the present embodiment, and may be capacitors having a fixed capacitance. Further, the one or more capacitors 220 may include a plurality of capacitors including a variable capacitor and/or a fixed capacitance capacitor.

The first lower terminal 211*b* is connected to the ground potential via a connecting member 214, which is a second conductive member, and is grounded. The second lower terminal 212*b* is connected to the ground potential via the connecting member 215, which is a third conductive member, and is grounded. As described above, the sub-coil assembly 210 is not connected to the power supply 30, and therefore, the RF power is not directly supplied to the sub-coil assembly 210. The connecting member 214 and the connecting member 215 may be provided separately as illustrated in the figure, or may be provided integrally.

As illustrated in FIG. 7, the connecting member 214 extends from the first lower terminal 211*b* to a first height H. The connecting member 215 extends from the second lower terminal 212*b* to the first height H. That is, the heights of the connecting members 214 and 215 are the same. Further, the first height H is higher than the heights of the first spiral coil 211 and the second spiral coil 212.

The arrangement of the first upper terminal 211*a* and the second upper terminal 212*a*, and the first lower terminal 211*b* and the second lower terminal 212*b* in a plan view is not particularly limited. However, since the voltage difference between the first upper terminal 211*a* and the second upper terminal 212*a* and between the first lower terminal 211*b* and the second lower terminal 212*b* is large, it is preferable to maintain a certain distance in practical use.

The sub-coil assembly 210 is inductively coupled to the main coil 200, and a current flows through the sub-coil assembly 210 in a direction that cancels the magnetic field generated by the current flowing through the main coil 200. By controlling the capacitance of the capacitor 220, it is possible to control the direction and magnitude of the current flowing through the sub-coil assembly 210 with respect to the current flowing through the main coil 200.

<Action of Antenna>

In the antenna 14 configured as described above, a magnetic field is generated in the Z-axis direction by the current flowing through the main coil 200 and the current flowing through the sub-coil assembly 210, and the generated magnetic field generates an induced electric field in the plasma processing chamber 10. Due to the induced electric field generated in the plasma processing chamber 10, the processing gas supplied from the gas introduction unit 13 into the plasma processing chamber 10 is turned into plasma. Then, the substrate W on the central region 111*a* is subjected to plasma processing such as etching or film formation processing by the ions and active species contained in the plasma.

<Effect of Antenna>

Next, the effect of the antenna 14 configured as described above will be described. In the present embodiment, the following four effects may be enjoyed as the primary effects of the antenna 14.

(1) The electric field strength of the sub-coil assembly 210 may be reduced.

(2) The symmetry of the coil structure on the lower surface of the sub-coil assembly 210 may be improved.

(3) The electric field strength at the end point of the main coil 200 may be reduced.

(4) The uniformity of the plasma distribution with respect to the substrate W may be improved while keeping the current flowing through the sub-coil assembly 210 (hereinafter, referred to as a "lead-in current") small.

(1) Electric Field Reduction of a Sub-Coil Assembly 210

As in the related art, for example, when the electric field strength of the antenna is high and the potential of the lower surface of the dielectric window is high, the plasma collides with the lower surface of the dielectric window, that is, the surface of the plasma processing space, causing wear and shortening the life of the parts. This phenomenon may be measured as contamination of the top plate material. Similarly, in the region where the electric field strength affects the plasma, the plasma distribution with respect to the wafer becomes non-uniform due to the change in the plasma density due to the electric field. Therefore, it is necessary to suppress the lower surface of the dielectric window to a low potential.

According to the present embodiment, in the sub-coil assembly 210, the first lower terminal 211*b* of the first spiral coil 211 is connected to the ground potential, and the second lower terminal 212*b* of the second spiral coil 212 is connected to the ground potential. That is, since the lower surface of the sub-coil assembly 210 is connected to the ground potential, the electric field strength of the sub-coil assembly 210 may be reduced. Therefore, the lower surface of the dielectric window 10*a* may be suppressed to a low potential, and as a result, the occurrence of contamination may be suppressed. It is also possible to make the plasma distribution with respect to the substrate W uniform in the circumferential direction.

Further, in the sub-coil assembly 210 of the present embodiment, the lower surface of the first spiral coil 211 and the lower surface of the second spiral coil 212 are formed symmetrically with respect to the center of the sub-coil assembly 210. Therefore, in the sub-coil assembly 210, the ground potential on the lower surface may be made uniform in the circumferential direction.

(2) Improved Symmetry of a Lower Surface of a Sub-Coil Assembly 210

In the present embodiment, the sub-coil assembly 210 has a double helix structure. Further, the lower surface of the first spiral coil 211 and the lower surface of the second spiral coil 212 are formed symmetrically with respect to the center of the sub-coil assembly 210. Therefore, in the sub-coil assembly 210, the current flowing in the circumferential direction may be made uniform, and the potential of the lower surface of the dielectric window 10*a* may be made uniform in the circumferential direction. As a result, the plasma distribution with respect to the substrate W may be made uniform in the circumferential direction.

The inventors of the present disclosure used the inner coil (single ring-shaped coil) described in Japanese Patent Laid-Open Publication No. 2019-067503 as a comparative example, and conducted an experiment to examine the current flowing through the lower surface of the dielectric window 10*a* during plasma processing in the case of using the sub-coil assembly 210 of the present embodiment. This current was measured by a current distribution sensor for measuring the in-plane distribution installed on the lower surface of the dielectric window 10*a*. In this experiment, the RF power supplied to the outer coil of the comparative example and the RF power supplied to the main coil 200 of the present embodiment were made equal. As a result, while the in-plane symmetry of the current distribution flowing through the dielectric window of the comparative example was non-uniform, the in-plane symmetry of the current distribution flowing through the lower surface of the dielectric window 10*a* of the present embodiment could be made uniform.

Specifically, the maximum standard deviation of the current value flowing through the dielectric window 10*a* of the present embodiment in the circumferential direction could be suppressed to about 55% as compared with that of the comparative example. In the sub-coil assembly 210 of the present embodiment, the number of turns of the first spiral coil 211 and the second spiral coil 212 was 1.5 turns. However, as a result of investigating the case of 2.5 turns, the maximum standard deviation could be further suppressed to about 53%.

Further, when the current values were compared in the experiment, the current value flowing through the dielectric window 10*a* of the present embodiment could be suppressed to about 45% as compared with that of the comparative example. In other words, according to the present embodiment, the lead-in current flowing through the sub-coil assembly 210 may be made equivalent while suppressing the current value on the lower surface of the dielectric window 10*a* as compared with that of the related art. As a result, the RF power supplied to the antenna 14 may be increased.

(3) Reduction of End Point Electric Field of a Main Coil 200

Figure 9:
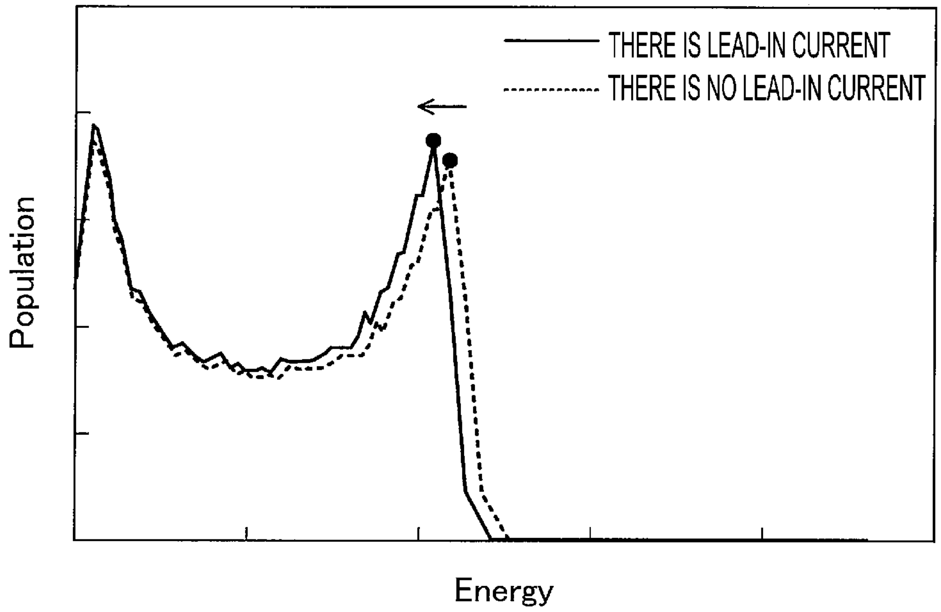
FIG. 9 is a graph illustrating experimental results of a comparative example.
Figure 10:
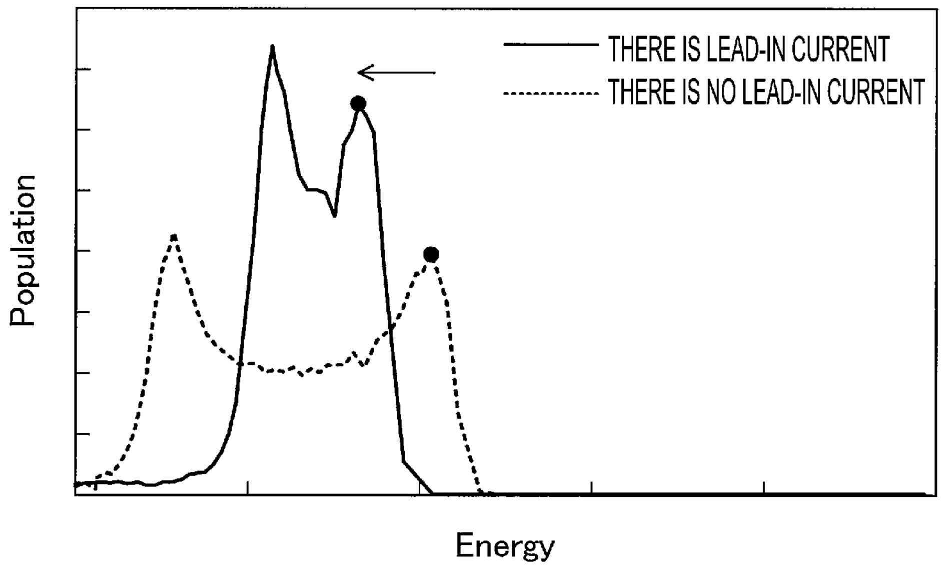
FIG. 10 is a graph illustrating the experimental results of the present embodiment.

The inventors of the present disclosure used the inner coil described in Japanese Patent Laid-Open Publication No. 2019-067503 as a comparative example, and conducted an experiment to examine the energy of ions on the lower surface of the dielectric window 10*a* during plasma processing in the case of using the sub-coil assembly 210 of the present embodiment. In this experiment, a comparison was made on the case where the lead-in current was applied to each of the inner coil of the related art and the sub-coil assembly 210 of the present embodiment and the case where the lead-in current was not applied thereto. FIG. 9 illustrates the experimental results of the comparative example, and FIG. 10 illustrates the experimental results of the present embodiment. In FIGS. 9 and 10, the horizontal axis (Energy) indicates the energy of ions on the lower surface of the dielectric window 10*a*, and the vertical axis (Population) indicates the number of ions reaching the lower surface of the dielectric window 10*a*. The measurement points for the energy and number of ions are the lower surface of the dielectric window below the end of the outer coil in the comparative example, and the lower surface of the dielectric window 10*a* below the end of the main coil 200 in the present embodiment.

In the comparative example, referring to FIG. 9, there is almost no change (see the arrow in the figure) in the graph peak (point in the figure) on the side with the larger ion energy in the case where the lead-in current is passed through the inner coil and the case where no lead-in current is passed. Therefore, it was not possible to reduce the electric field strength at the end points of the outer coil.

In the present embodiment, referring to FIG. 10, when the lead-in current is passed through the sub-coil assembly 210, the graph peak (point in the figure) on the side with the larger ion energy shifts (see the arrow in the figure) so that the ion energy becomes smaller than when the lead-in current is not passed. Therefore, when the sub-coil assembly 210 of the present embodiment is used, the electric field strength at the end point of the main coil 200 may be reduced.

The inventors of the present disclosure used the inner coil described in Japanese Patent Laid-Open Publication No. 2019-067503 as a comparative example, and conducted an experiment to investigate the amount of contamination during plasma processing in the case of using the sub-coil assembly 210 of the present embodiment. In the comparative example and the present embodiment, the material of the dielectric window 10*a* contains itria, and in this experiment, the amount of contamination of the itria system generated by sputtering of the dielectric window 10*a* was measured. As a result, the amount of contamination per unit area (number of contaminants) in the present embodiment was suppressed to about 20% as compared with that of the comparative example. In other words, in the present embodiment, the electric field strength at the end point of the main coil may be reduced, and as a result, the amount of contamination may be reduced.

Further, in this experiment, the outer coil of the comparative example and the main coil 200 of the present embodiment are respectively arranged apart from the dielectric window 10*a*. As a result of diligent studies by the inventors of the present disclosure, it was found that when the outer coil of the comparative example was provided in contact with the dielectric window 10*a*, the amount of contamination per unit area increased as compared with the case where the outer coil was arranged apart. Therefore, from this point of view, it is preferable that the main coil 200 of the present embodiment is arranged apart from the dielectric window 10*a* and above the dielectric window 10*a*.

(4) Improvement of Plasma Distribution Uniformity with a Small Lead Current

In the present embodiment, since the sub-coil assembly 210 has a double helix structure, the inductance of the sub-coil assembly 210 may be increased. As a result, the uniformity of the plasma distribution with respect to the substrate W may be improved while reducing the lead-in current flowing through the sub-coil assembly 210.

The inventors of the present disclosure used the inner coil described in Japanese Patent Laid-Open Publication No. 2019-067503 as a comparative example, and conducted an experiment to examine the currents flowing through each of the inner coil and the sub-coil assembly 210 during plasma processing in the case of using the sub-coil assembly 210 of the present embodiment. In this experiment, the RF power supplied to the outer coil of the comparative example and the RF power supplied to the main coil 200 of the present embodiment were made equal. As a result, the current value of the sub-coil assembly 210 of the present embodiment could be suppressed to be smaller than the current value of the inner coil of the comparative example.

The inventors of the present disclosure used the inner coil described in Japanese Patent Laid-Open Publication No. 2019-067503 as a comparative example, and conducted an experiment to investigate a relationship between the lead-in current during plasma processing and the ion distribution with respect to the substrate W (ion distribution in the radial direction of the wafer) in the case of using the sub-coil assembly 210 of the present embodiment. In this experiment, the current value flowing through the substrate W was measured as the ion distribution. In such a case, in the comparative example, even when the current value of the lead-in current flowing through the inner coil was changed, the ion distribution incident on the wafer almost did not change. Meanwhile, in the present embodiment, when the current value of the lead-in current flowing through the sub-coil assembly 210 was changed, the amount of ions with respect to the substrate W increased and the ion distribution changed. Here, the magnitude of the ion current on the substrate W correlates with the density of the plasma on the substrate W. Therefore, in the present embodiment, the ion distribution with respect to the substrate W, that is, the plasma distribution may be controlled by adjusting the current value of the lead-in current. In other words, the width of controlling the plasma for ensuring the uniformity of the plasma distribution with respect to the substrate W in the circumferential direction may be broadened, and the controllability of the plasma distribution may be improved.

Further, the inventors of the present disclosure used the inner coil described in Japanese Patent Laid-Open Publication No. 2019-067503 as a comparative example, and conducted an experiment to investigate a relationship between the lead-in current during plasma processing and the ion distribution with respect to the substrate W in the case of using the sub-coil assembly 210 of the present embodiment. In this experiment, 3σ of the current value flowing through the substrate W was calculated as the ion distribution. Then, in this experiment, the current value of the lead-in current when the 3σ becomes the minimum, that is, the current value of the lead-in current when the ion distribution becomes uniform becomes the optimum value. As a result, the optimum current value of the lead-in current corresponding to the minimum 3σ in the present embodiment may be suppressed to be smaller than that of the comparative example. In other words, in the present embodiment, the uniformity of the plasma distribution with respect to the substrate W in the circumferential direction may be improved with a small lead-in current.

Further, in the sub-coil assembly 210 of the present embodiment, the number of turns of the first spiral coil 211 and the second spiral coil 212 was 1.5 turns, but may be set to any number of one or more, as described above. Particularly, from the viewpoint of improving the uniformity of the plasma distribution with a small lead-in current, it is preferable that the number of turns is large, and it may be, for example, 1.5 turns to 2.5 turns.

According to the above-described embodiment, since the sub-coil assembly 210 has a double helix structure and the lower surface of the sub-coil assembly 210 is connected to the ground potential, the electric field strength at the end point of the main coil 200 may be reduced, and the controllability of the plasma distribution may be improved. Therefore, it is possible to improve the uniformity of the plasma distribution with respect to the substrate W while suppressing the occurrence of contamination during the plasma processing.

Another Embodiment

Figure 11:
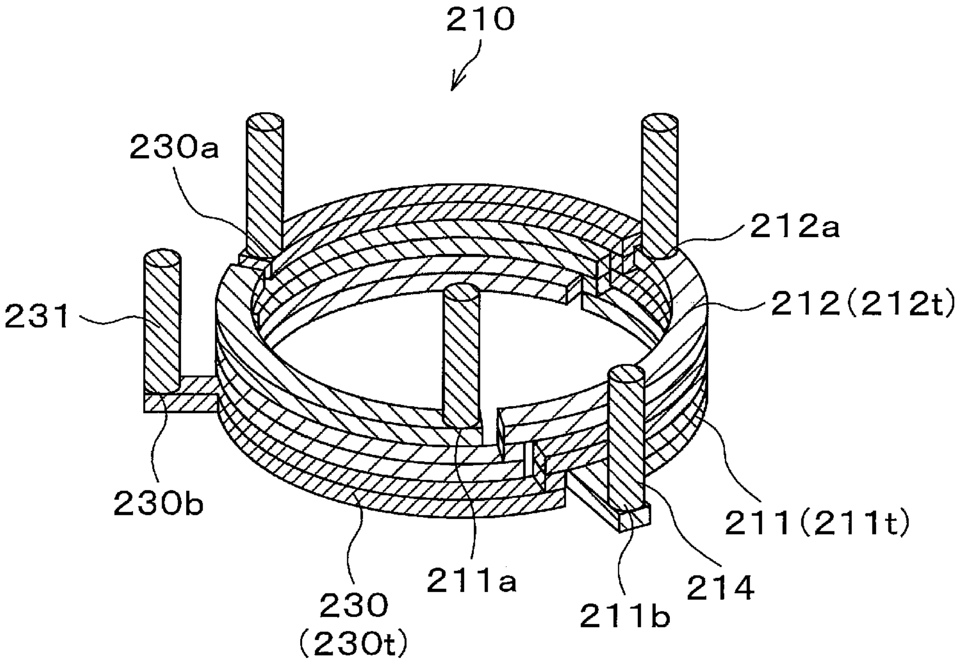
FIG. 11 is a perspective view illustrating an outline of the configuration of a sub-coil assembly according to another embodiment.
Figure 12:
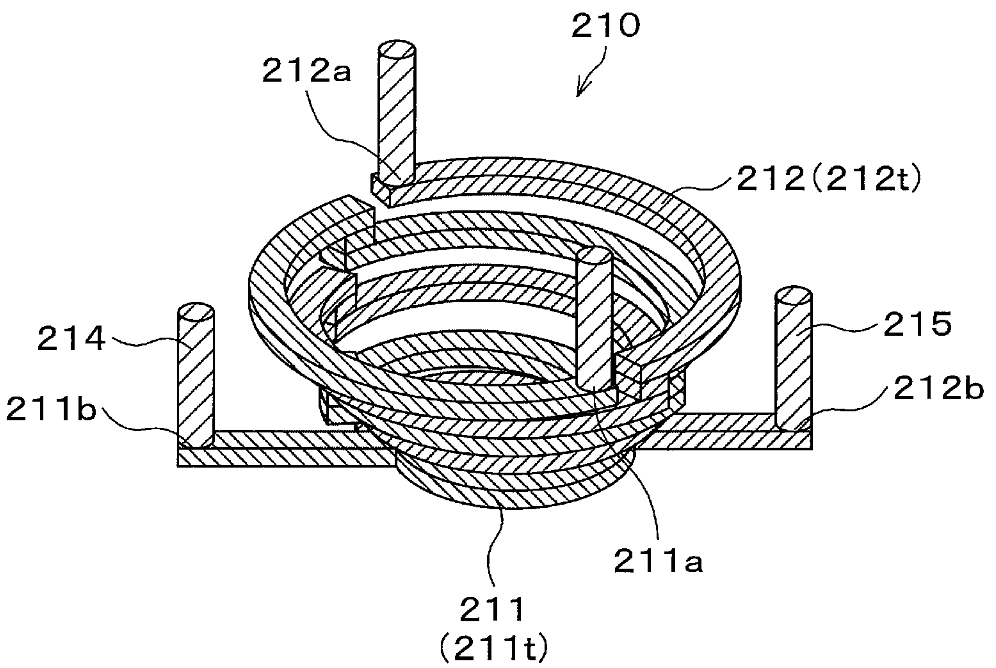
FIG. 12 is a perspective view illustrating an outline of the configuration of a sub-coil assembly according to still another embodiment.
Figure 13:
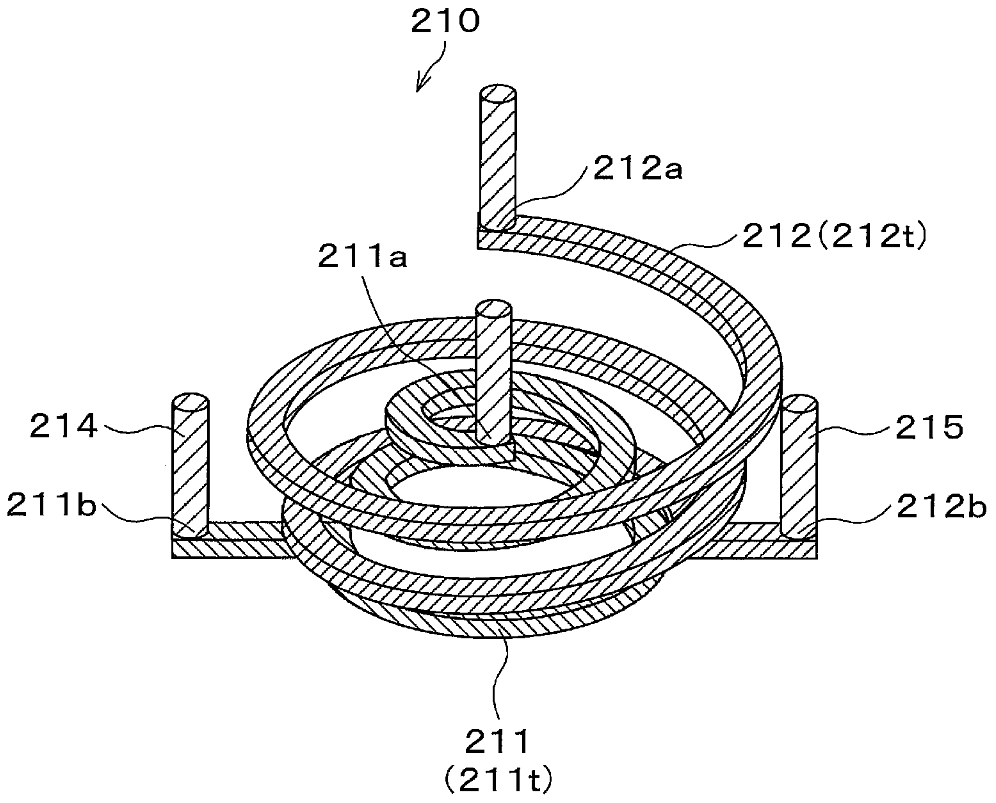
FIG. 13 is a perspective view illustrating an outline of the configuration of a sub-coil assembly according to yet another embodiment.

In the above-described embodiment, the sub-coil assembly 210 has a substantially cylindrical double helix structure, but the configuration of the sub-coil assembly 210 is not limited thereto. FIGS. 11 to 13 are perspective views illustrating an outline of the configuration of the sub-coil assembly 210 according to another embodiment.

As illustrated in FIG. 11, the sub-coil assembly 210 may have a multiple helix structure. The sub-coil assembly 210 has a third spiral coil 230 in addition to the first spiral coil 211 and the second spiral coil 212. The third spiral coil has at least one turn 230*t*. In the side view, each turn 211*t* of the first spiral coil 211, each turn 212*t* of the second spiral coil 212, and each turn 230*t* of the third spiral coil 230 are arranged in order in the vertical direction. The central axis of the outer shape of the third spiral coil 230 coincides with the Z axis, and the first spiral coil 211, the second spiral coil 212, and the third spiral coil 230 are arranged coaxially. The third spiral coil 230 is formed in a substantially circular shape in a plan view. Further, the diameter of the third spiral coil 230 is the same as the diameter of the first spiral coil 211 and the diameter of the second spiral coil 212 in the vertical direction. As described above, the sub-coil assembly 210 has a substantially cylindrical triple helix structure.

The upper surface of the first spiral coil 211, the upper surface of the second spiral coil 212, and the upper surface of the third spiral coil 230 are formed symmetrically with respect to the center of the sub-coil assembly 210. That is, the upper surface of the first spiral coil 211, the upper surface of the second spiral coil 212, and the upper surface of the third spiral coil 230 each have a substantially arc shape with a central angle of about 120 degrees.

Further, the lower surface of the first spiral coil 211, the lower surface of the second spiral coil 212, and the lower surface of the third spiral coil 230 are formed symmetrically with respect to the center of the sub-coil assembly 210. That is, the lower surface of the first spiral coil 211, the lower surface of the second spiral coil 212, and the lower surface of the third spiral coil 230 each have a substantially arc shape with a central angle of about 120 degrees.

The third spiral coil 230 has a third upper terminal 230*a* at the upper end and a third lower terminal 230*b* at the lower end. The first upper terminal 211*a*, the second upper terminal 212*a*, and the third upper terminal 230*a* are arranged at a symmetrical position with respect to the center of the sub-coil assembly 210, that is, at a position where the central angle of the adjacent upper terminals is about 120 degrees. The first lower terminal 211*b*, the second lower terminal 212*b*, and the third lower terminal 230*b* are also arranged at a symmetrical position with respect to the center of the sub-coil assembly 210, that is, at a position where the central angle of the adjacent lower terminal is about 120 degrees.

The first upper terminal 211*a*, the second upper terminal 212*a*, and the third upper terminal 230*a* are connected by a connecting member 213 (not illustrated). The connecting member 213 is connected to the ground potential via a capacitor 220 and is grounded. That is, the first lower terminal 211*a*, the second lower terminal 212*a*, and the third lower terminal 230*a* are connected to the ground potential via a common capacitor 220.

The third lower terminal 230*b* is connected to the ground potential via a connecting member 231 and is grounded.

In the present embodiment as well, the same effects as those in the above-described embodiment may be enjoyed. That is, since the sub-coil assembly 210 has a triple helix structure and the lower surface of the sub-coil assembly 210 is connected to the ground potential, the electric field strength at the end point of the main coil 200 may be reduced, and the controllability of the plasma distribution may be improved. In the present embodiment, the sub-coil assembly 210 has a triple helix structure, but may have a multiple helix structure of a quadruple helix structure or higher.

As illustrated in FIG. 12, the sub-coil assembly 210 may have a substantially conical shape. In the sub-coil assembly 210, the diameter of the first spiral coil 211 and the diameter of the second spiral coil 212 are the same at the same height. Further, the diameter of each turn 211*t* of the first spiral coil 211 and the diameter of each turn 212*t* of the second spiral coil 212 are different from each other in the vertical direction. In the example illustrated in FIG. 12, the diameters of the first spiral coil 211 and the second spiral coil 212 gradually decrease downward. Further, the lower surface of the first spiral coil 211 and the lower surface of the second spiral coil 212 are formed symmetrically with respect to the center of the sub-coil assembly 210.

In the present embodiment as well, the same effects as those in the above-described embodiment may be enjoyed. That is, since the sub-coil assembly 210 has a double helix structure and the lower surface of the sub-coil assembly 210 is connected to the ground potential, the electric field strength at the end point of the main coil 200 may be reduced, and the controllability of the plasma distribution may be improved. In the present embodiment, the sub-coil assembly 210 has a substantially conical shape, but the shape of the sub-coil assembly 210 is not limited thereto.

As illustrated in FIG. 13, in the sub-coil assembly 210, the diameter of the first spiral coil 211 and the diameter of the second spiral coil 212 may be different from each other at the same height position. In the illustrated example, the diameter of the first spiral coil 211 gradually increases from the upper side to the lower side. Meanwhile, the diameter of the second spiral coil 212 gradually decreases from the upper side to the lower side. On the lower surface of the sub-coil assembly 210, the diameter of the first spiral coil 211 and the diameter of the second spiral coil 212 are the same. Further, the lower surface of the first spiral coil 211 and the lower surface of the second spiral coil 212 are formed symmetrically with respect to the center of the sub-coil assembly 210.

In the present embodiment as well, the same effects as those in the above-described embodiment may be enjoyed. That is, since the sub-coil assembly 210 has a double helix structure and the lower surface of the sub-coil assembly 210 is connected to the ground potential, the electric field strength at the end point of the main coil 200 may be reduced, and the controllability of the plasma distribution may be improved.

Still Another Embodiment

In the above-described embodiment, the sub-coil assembly 210 is arranged inside the main coil 200 in the radial direction, but may be arranged outside in the radial direction. Further, the sub-coil assembly 210 may be arranged on both the radial inner side and the radial outer side of the main coil 200. That is, the sub-coil assembly 210 may have a first sub-coil assembly arranged radially inside the main coil 200 and a second spiral coil assembly arranged radially outside. Further, the sub-coil assembly 210 may be arranged above and/or below the main coil 200.

Yet Another Embodiment

In the sub-coil assembly 210 of the above-described embodiment, the first upper terminal 211*a* of the first spiral coil 211 and the second upper terminal 212*a* of the second spiral coil 212 are connected to a common capacitor 220 via a connecting member 213, but may be connected to separate capacitors (not illustrated). In such a case, the first upper terminal 211*a* is connected to the ground potential via the first capacitor (not illustrated), and the second upper terminal 212*a* is connected to the ground potential via the second capacitor (not illustrated).

Yet Another Embodiment

In the sub-coil assembly 210 of the above-described embodiment, the connecting member 213 is formed in a substantially Y shape in a plan view, but the planar shape of the connecting member 213 is not limited thereto. For example, the planar shape of the connecting member 213 may be substantially U-shaped. Further, as described above, the sub-coil assembly 210 is inductively coupled to the main coil 200, and a current flows through the sub-coil assembly 210 in a direction that cancels the magnetic field generated by the current flowing through the main coil 200. Therefore, the connecting member 213 may be arranged to extend vertically upward from the first upper terminal 211*a* and the second lower terminal 212*b* so as not to interfere with this magnetic field, and to secure a sufficient separation distance.

Yet Another Embodiment

In the plasma processing apparatus 1 of the above-described embodiment, the processing gas is supplied to the plasma processing space 10*s* from the gas introduction unit 13 provided in the central opening of the dielectric window 10*a*. However, in addition to the gas introduction unit 13, a plurality of injection ports for injecting the processing gas toward the Z axis may be provided in the circumferential direction along the side wall of the plasma processing chamber 10.

Yet Another Embodiment

In the sub-coil assembly 210 of the above-described embodiment, the connecting member 213 is connected to the ground potential via the capacitor 220, and the connecting members 214 and 215 are connected to the ground potential, but the connection destinations of these connecting members 213 to 215 are not limited thereto. FIGS. 11 to 14 are perspective views illustrating an outline of the configuration of the sub-coil assembly 210 according to another embodiment.

Figure 14:
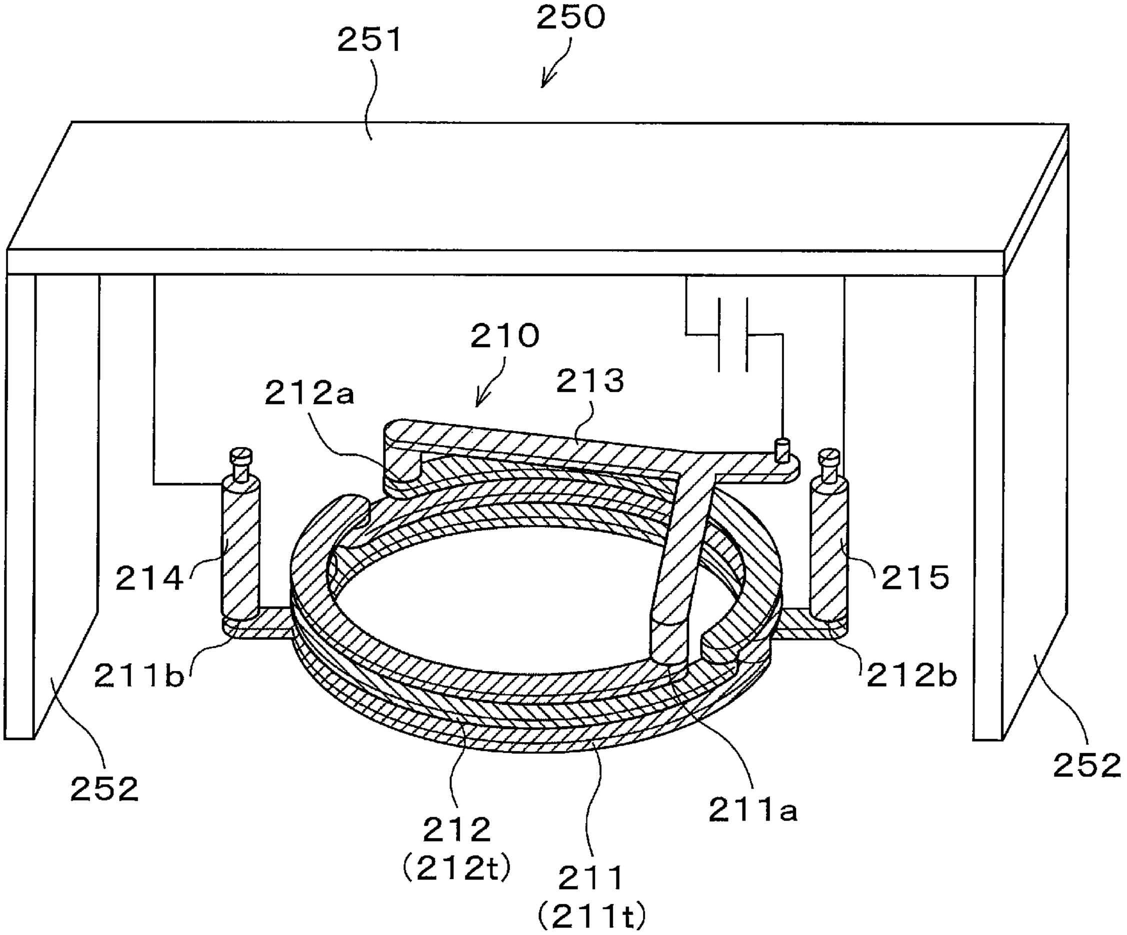
FIG. 14 is a perspective view illustrating an outline of the configuration of a sub-coil assembly according to yet another embodiment.

As illustrated in FIG. 14, the sub-coil assembly 210 is provided in a conductive housing 250. The conductive housing 250 is provided in the upper portion of or above the plasma processing chamber 10. The conductive housing 250 is connected to the ground potential. The conductive housing 250 has a top plate 251 and a side wall 252. In the example of FIG. 14, two left and right side walls 252 of the sub-coil assembly 210 are illustrated, and the illustration of the front and rear side walls 252 of the sub-coil assembly 210 is omitted for easy understanding of the technique.

The connecting members 213 to 215 of the sub-coil assembly 210 are each connected to the top plate 251 of the conductive housing 250. That is, the connecting members 213 to 215 are connected to the conductive housing 250 at a position higher than the uppermost portions of the first spiral coil 211 and the second spiral coil 212. The connecting member 213 is connected to the top plate 251 via a capacitor 253. Further, the connecting members 214 and 215 may be connected to the side wall 252 at a position higher than the uppermost portions of the first spiral coil 211 and the second spiral coil 212.

In such a case, the sub-coil assembly 210 is connected to the ground potential via the conductive housing 250, and the conductive housing 250 may be used as a current distribution mechanism.

Yet Another Embodiment

Next, the configuration of the antenna 14 according to yet another embodiment will be described. In the plasma processing apparatus 1 of the above-described embodiment, the main coil 200 arranged radially outside is connected to the RF potential, and the sub-coil assembly 210 arranged radially inside is connected to the ground potential. In yet another embodiment, the main coil assembly arranged radially inside is connected to the RF potential and at least one sub-coil disposed radially outside is connected to the ground potential.

FIGS. 15 to 20 are perspective views illustrating an outline of the configuration of the antenna 14 according to yet another embodiment, and illustrate the first example to the sixth example of yet another embodiment, respectively. As illustrated in FIGS. 15 to 20, the antenna 14 is an antenna assembly having a main coil assembly 300 and at least one sub-coil (the first sub-coil 310, the second sub-coil 320).

The main coil assembly 300 is commonly provided in the first to sixth examples. The main coil assembly 300 has the same configuration as the sub-coil assembly 210 in the above-described embodiment. That is, the main coil assembly 300 has a first spiral coil 301, a second spiral coil 302, and connecting members 303 to 305. The first spiral coil 301, the second spiral coil 302, and the connecting members 303 to 305 correspond to the first spiral coil 211, the second spiral coil 212, and the connecting members 213 to 215 in the above-described embodiment, respectively.

The first spiral coil 301 has one or more turns 301*t* and the second spiral coil 302 has one or more turns 302*t*. Each turn 301*t* of the first spiral coil 301 and each turn 302*t* of the second spiral coil 302 are arranged alternately in the vertical direction in the side view.

The first spiral coil 301 has a first upper terminal 301*a* at the upper end and a first lower terminal 301*b* at the lower end. The second spiral coil 302 has a second upper terminal 302*a* at the upper end and a second lower terminal 302*b* at the lower end. The first upper terminal 301*a* and the second upper terminal 302*a* are connected by a connecting member 303 which is a first conductive member. The connecting member 303 is connected to the first RF generator of the RF power supply, that is, the RF potential. The first lower terminal 301*b* is connected to the ground potential via the connecting member 304, which is a second conductive member, and is grounded. The second lower terminal 302*b* is connected to the ground potential via the connecting member 305, which is a third conductive member, and is grounded. Further, the connecting member 304 and the connecting member 305 may be provided separately as illustrated in the figure, or may be provided integrally.

Other configurations of the first spiral coil 301 and the second spiral coil 302 are the same as the configurations of the first spiral coil 211 and the second spiral coil 212 in the above-described embodiment, and thus the description thereof will be omitted.

As described above, in any of the first to sixth examples, since the main coil assembly 300 has the same configuration as the sub-coil assembly 210 in the above-described embodiment, the same effects as the (1) to (4) in the above-described embodiment may be enjoyed.

At least one sub-coil (sub-coils 310 and 320) is arranged radially outside the main coil assembly 300 so as to surround the main coil assembly 300. The sub-coils 310 and 320 have different configurations in each of the first to sixth examples. Hereinafter, the first to sixth examples will be described. In the examples illustrated in FIGS. 15 to 20, the sub-coils 310 and 320 are represented by lines in order to facilitate the understanding of the technique, but the coils actually have an arbitrary cross-sectional shape.

First Example of Another Embodiment

Figure 15:
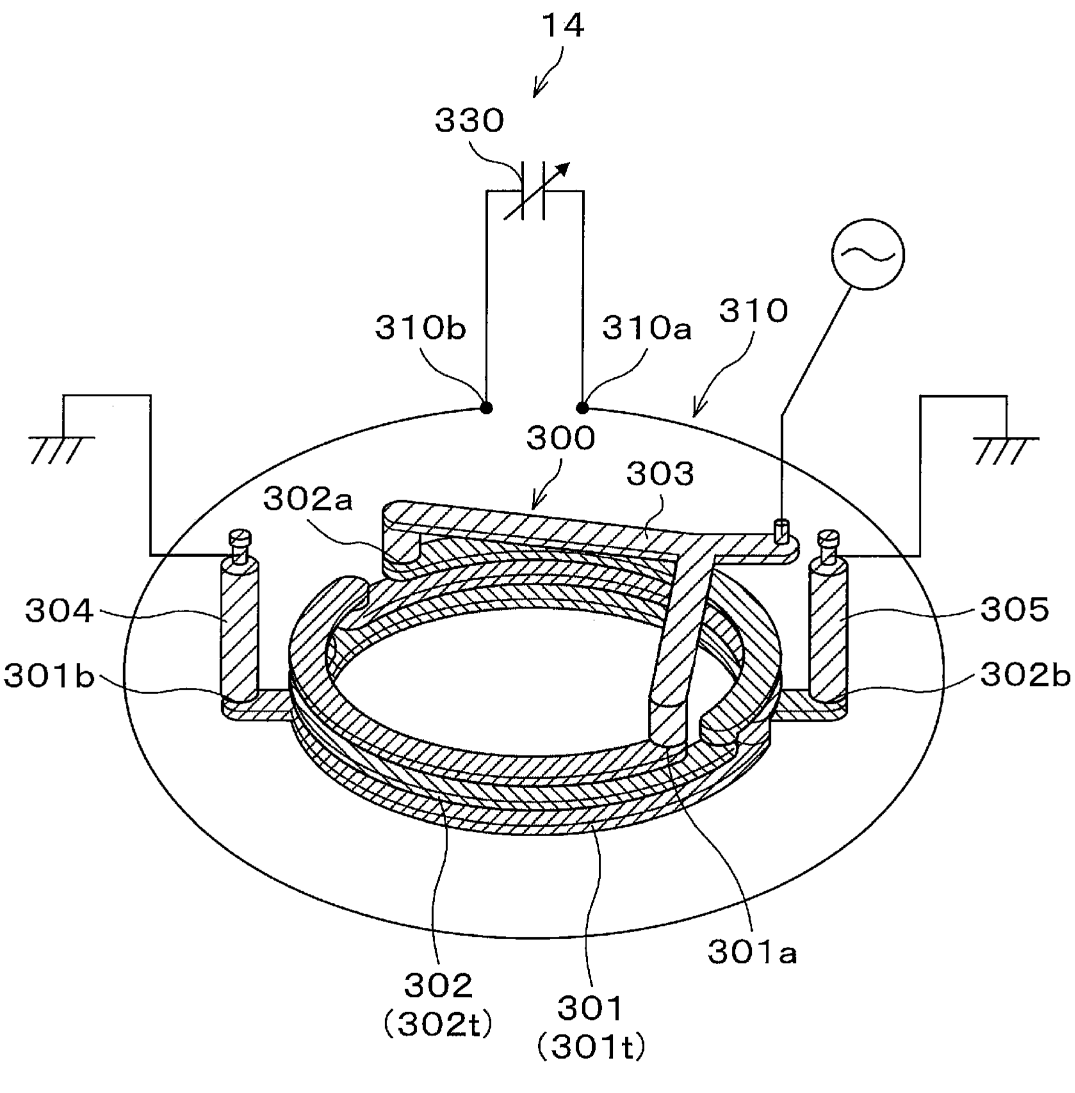
FIG. 15 is a perspective view illustrating an outline of an antenna configuration according to a first example of another embodiment.

In the first example, as illustrated in FIG. 15, at least one sub-coil includes a first sub-coil 310. The first sub-coil 310 is a flat coil formed in a substantially circular shape. The central axis of the outer shape of the first sub-coil 310 coincides with the Z axis and is arranged coaxially with the main coil assembly 300.

The first spiral coil 310 has a first terminal 310*a* and a second terminal 310*b*. The first terminal 310*a* and the second terminal 310*b* are connected to each other via a capacitor 330. The capacitor 330 is a variable capacitor.

The first sub-coil 310 is inductively coupled to the main coil assembly 300, and a current flows through the first sub-coil 310 in a direction that cancels the magnetic field generated by the current flowing through the main coil assembly 300. By controlling the capacitance of the capacitor 330, it is possible to control the direction and magnitude of the current flowing through the first sub-coil 310 with respect to the current flowing through the main coil assembly 300.

Second Example of Another Embodiment

Figure 16:
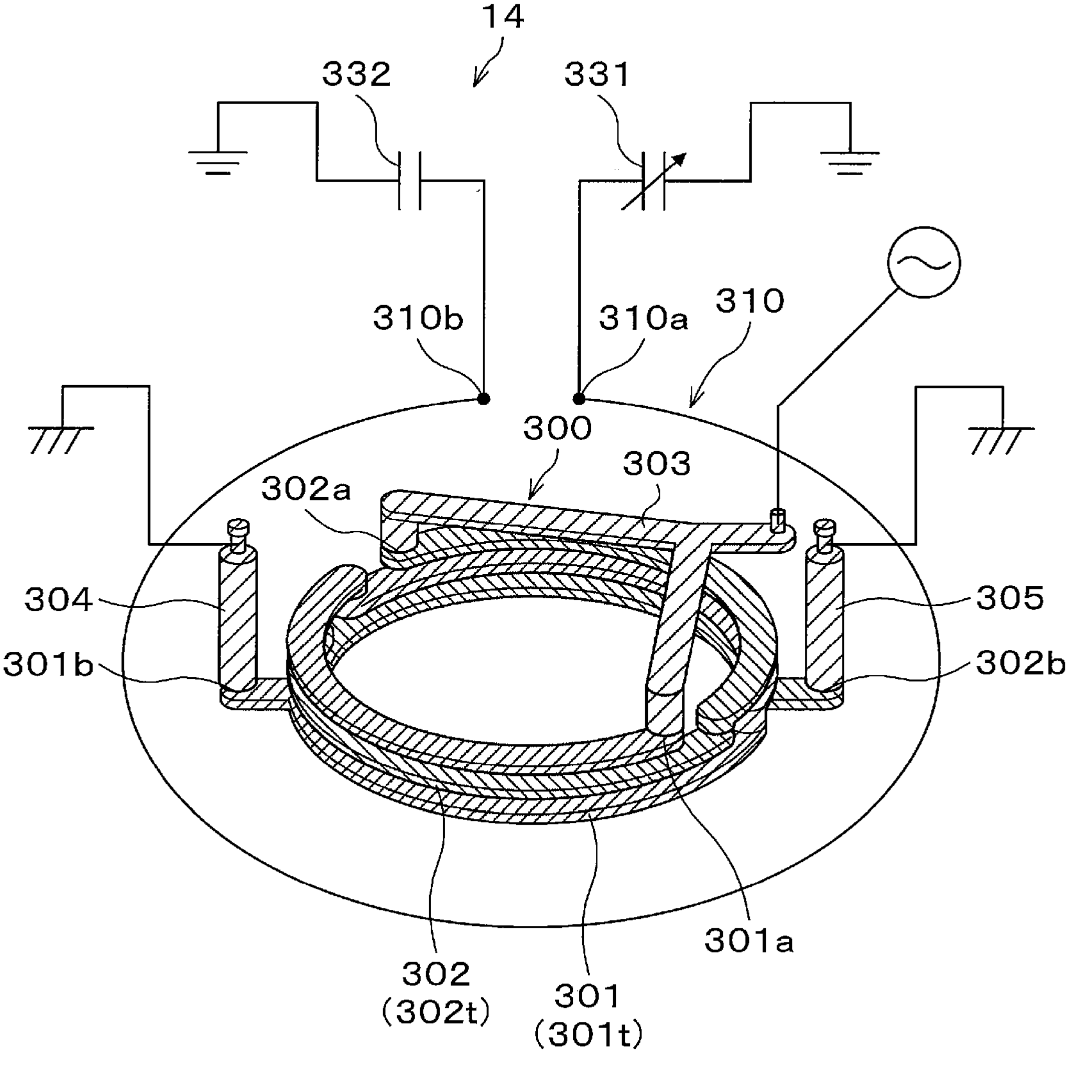
FIG. 16 is a perspective view illustrating an outline of an antenna configuration according to a second example of another embodiment.

In the second example, as illustrated in FIG. 16, at least one sub-coil includes a first sub-coil 310. The first sub-coil 310 has the same configuration as that of the first example, and has a first terminal 310*a* and a second terminal 310*b*.

The first terminal 310*a* is connected to the ground potential via a capacitor 331. The capacitor 331 is a variable capacitor. The second terminal 310*b* is connected to the ground potential via a capacitor 332. The capacitor 332 is a fixed capacitance capacitor. Also, the capacitor 332 may be a variable capacitor. The capacitor 332 is not always necessary and may be omitted.

Third Example of Another Embodiment

Figure 17:
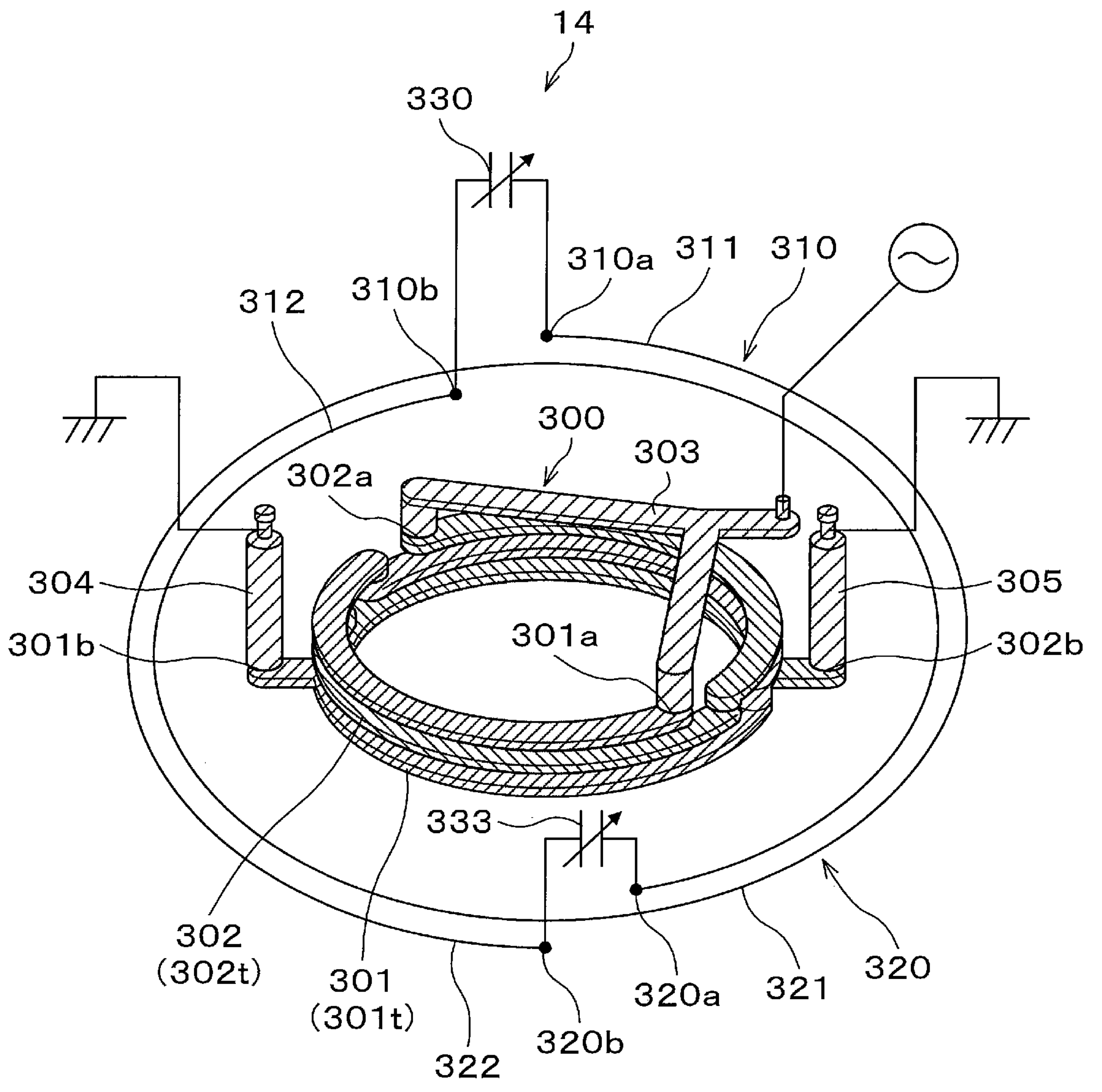
FIG. 17 is a perspective view illustrating an outline of an antenna configuration according to a third example of another embodiment.

In the third example, as illustrated in FIG. 17, at least one sub-coil includes a first sub-coil 310 and a second sub-coil 320. The first sub-coil 310 has the same configuration as that of the first example, and has a first terminal 310*a* and a second terminal 310*b*. The first terminal 310*a* and the second terminal 310*b* are connected to each other via a capacitor 330.

The second sub-coil 320 is a flat coil formed in a substantially circular shape. The second sub-coil 320 has the same shape as the first sub-coil 310 and has the same diameter. The central axis of the outer shape of the second sub-coil 320 coincides with the Z axis and is arranged coaxially with the first sub-coil 310.

The second spiral coil 320 has a third terminal 320*a* and a fourth terminal 320*b*. The third terminal 320*a* and the fourth terminal 320*b* are connected to each other via a capacitor 333. The capacitor 333 is a variable capacitor.

Similarly to the first sub-coil 310, the first sub-coil 320 is inductively coupled to the main coil assembly 300, and a current flows through the second sub-coil 320 in a direction that cancels the magnetic field generated by the current flowing through the main coil assembly 300. By controlling the capacitance of the capacitor 333, it is possible to control the direction and magnitude of the current flowing through the second sub-coil 320 with respect to the current flowing through the main coil assembly 300.

The first spiral coil 310 has a first coil portion 311 and a second coil portion 312. The first coil portion 311 is a semicircular portion from the first terminal 310*a* to the midpoint of the first sub-coil 310. The second coil portion 312 is a semicircular portion from the second terminal 310*b* to the midpoint of the first sub-coil 310. The second sub-coil 320 has a third coil portion 321 and a fourth coil portion 322. The third coil portion 321 is a semicircular portion from the third terminal 320*a* to the midpoint of the second sub-coil 320. The fourth coil portion 322 is a semicircular portion from the fourth terminal 320*b* to the midpoint of the second sub-coil 320. The first coil portion 311 is arranged radially outside the third coil portion 321. The second coil portion 312 is arranged radially inside the fourth coil portion 322.

The first terminal 310*a* and the second terminal 310*b* of the first sub-coil 310, and the third terminal 320*a* and the fourth terminal 320*b* of the second sub-coil 320 are arranged at a symmetrical position (position having a central angle of about 180 degrees) with the center interposed therebetween. That is, the first sub-coil 310 (the first terminal 310*a* and the second terminal 310*b*) and the second sub-coil 320 (the third terminal 320*a* and the fourth terminal 320*b*) are arranged symmetrically. Further, the first sub-coil 310 and the second sub-coil 320 have the same size and the same shape, and these are arranged in a nested manner at equal intervals.

Here, the first terminal 310*a*, the second terminal 310*b*, the third terminal 320*a*, and the fourth terminal 320*b* become singular points, and the current may be biased toward the singular points. In this regard, when the singular points are arranged symmetrically as described above, the bias of the current flowing through the first sub-coil 310 and the second sub-coil 320 may be suppressed, and the circumferential uniformity of the magnetic field strength may be improved.

Fourth Example of Another Embodiment

Figure 18:
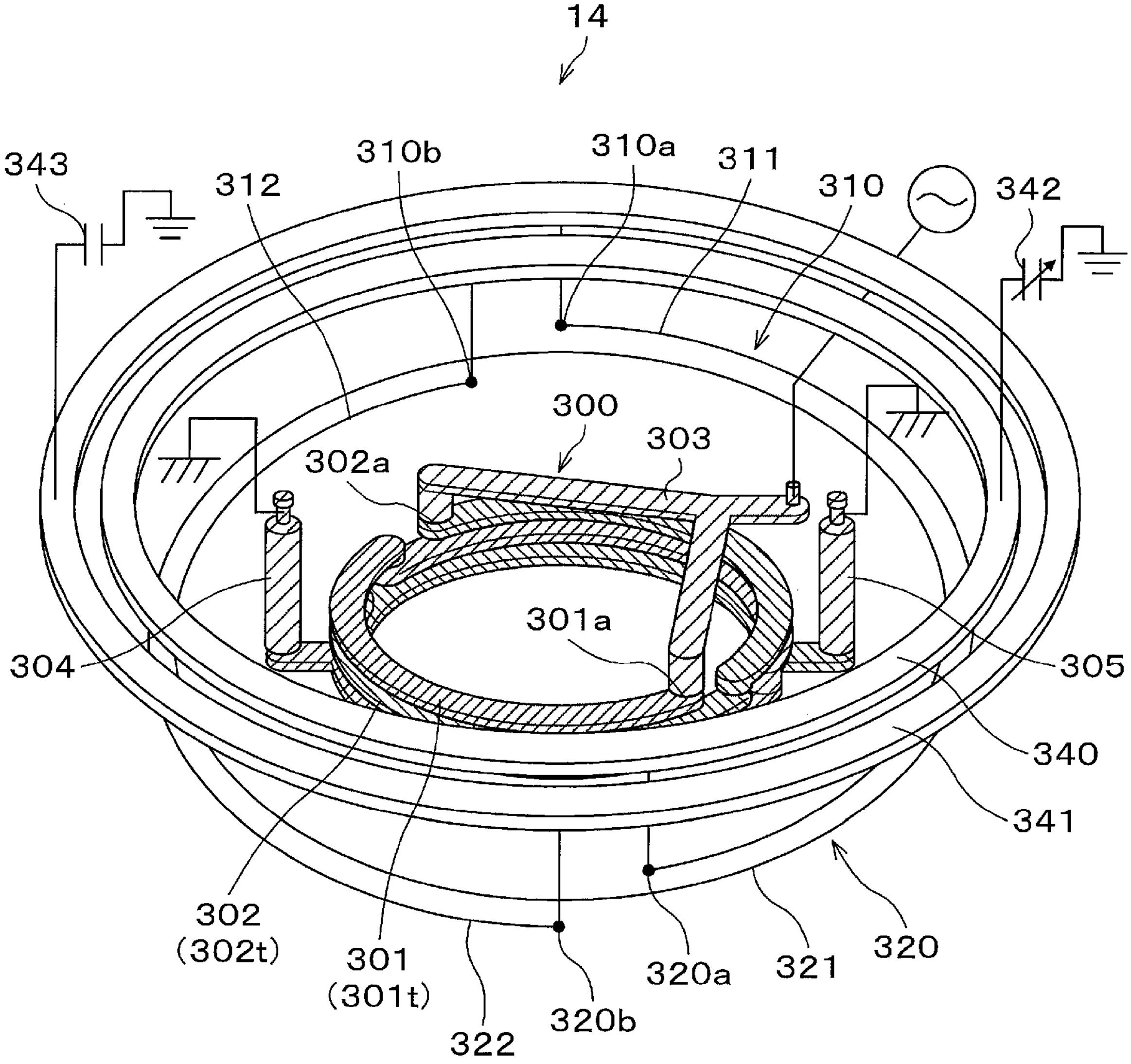
FIG. 18 is a perspective view illustrating an outline of an antenna configuration according to a fourth example of another embodiment.

In the fourth example, as illustrated in FIG. 18, at least one sub-coil includes a first sub-coil 310 and a second sub-coil 320. As in the third example, the first sub-coil 310 has a first terminal 310*a* and a second terminal 310*b*, and the second sub-coil 320 has a third terminal 320*a* and a fourth terminal 320*b*. Further, as in the third example, the first terminal 310*a* and the second terminal 310*b*, and the third terminal 320*a* and the fourth terminal 320*b* are arranged symmetrically.

The second terminal 310*b* and the third terminal 320*a* are each connected to a first conductive plate 340. The first conductive plate 340 has a substantially annular shape in a plan view. The first terminal 310*a* and the fourth terminal 320*b* are each connected to a second conductive plate 341. The second conductive plate 341 has a substantially annular shape in a plan view, and is arranged outside in the radial direction of the first conductive plate 340. The central axis of the outer shape of the first conductive plate 340 and the central axis of the outer shape of the second conductive plate 341 coincide with the Z axis and are arranged coaxially. The planar shapes of the first conductive plate 340 and the second conductive plate 341 are not limited to this example.

The first conductive plate 340 is connected to the ground potential via a capacitor 342. The capacitor 342 is a variable capacitor. The second conductive plate 341 is connected to the ground potential via a capacitor 343. The capacitor 343 is a fixed capacitance capacitor. Also, the capacitor 343 may be a variable capacitor. The capacitor 343 is not always necessary and may be omitted.

The current flowing through the first sub-coil 310 is distributed to the first conductive plate 340 and the second conductive plate 341. The current flowing through the second sub-coil 320 is also distributed to the first conductive plate 340 and the second conductive plate 341. Then, since the distributed current flows in the circumferential direction through the first conductive plate 340 and the second conductive plate 341, the circumferential bias of the current may be suppressed, and the circumferential uniformity of the magnetic field strength may be further improved.

Fifth Example of Another Embodiment

Figure 19:
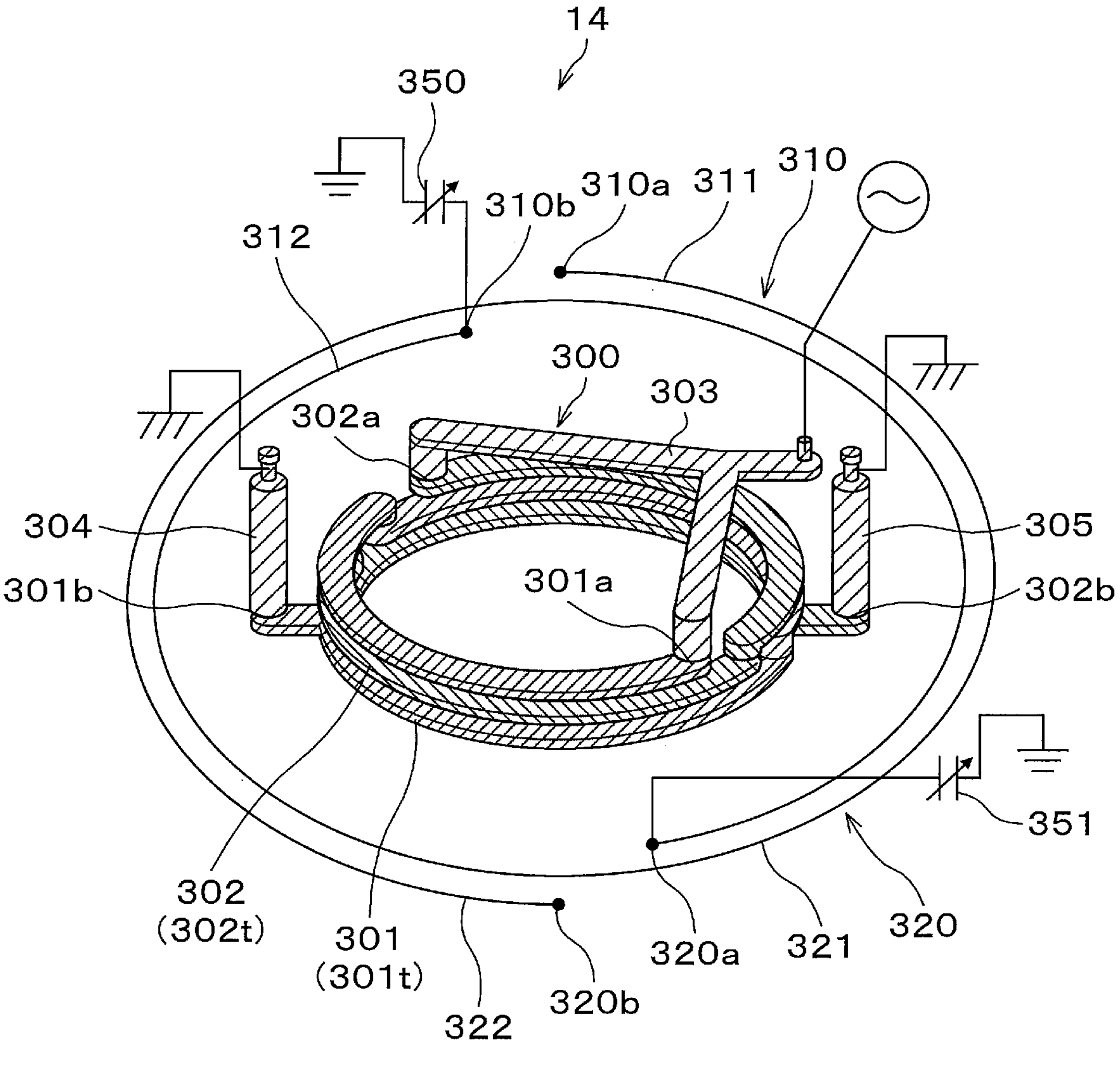
FIG. 19 is a perspective view illustrating an outline of an antenna configuration according to a fifth example of another embodiment.

In the fifth example, as illustrated in FIG. 19, at least one sub-coil includes a first sub-coil 310 and a second sub-coil 320. As in the third example, the first sub-coil 310 has a first terminal 310*a* and a second terminal 310*b*, and the second sub-coil 320 has a third terminal 320*a* and a fourth terminal 320*b*.

In the first sub-coil 310, the first terminal 310*a* is opened. The second terminal 310*b* is connected to the ground potential via a capacitor 350. The capacitor 350 is a variable capacitor. Further, in the second sub-coil 320, the third terminal 320*a* is connected to the ground potential via a capacitor 351. The capacitor 351 is a variable capacitor. Further, the fourth terminal 320*b* is opened.

Since the first terminal 310*a* of the first sub-coil 310 is an open end, the voltage rises at the first terminal 310*a*, and plasma ignition becomes easy. Similarly, since the fourth terminal 320*b* of the second sub-coil 320 is an open end, the voltage rises at the fourth terminal 320*b*, and plasma ignition becomes easy.

The second terminal 310*b* of the first sub-coil 310, and the third terminal 320*a* of the second sub-coil 320 are arranged at a symmetrical position with the center interposed therebetween. Therefore, the bias of the current flowing through the first sub-coil 310 and the second sub-coil 320 may be suppressed, and the circumferential uniformity of the magnetic field strength may be improved.

Sixth Example of Another Embodiment

Figure 20:
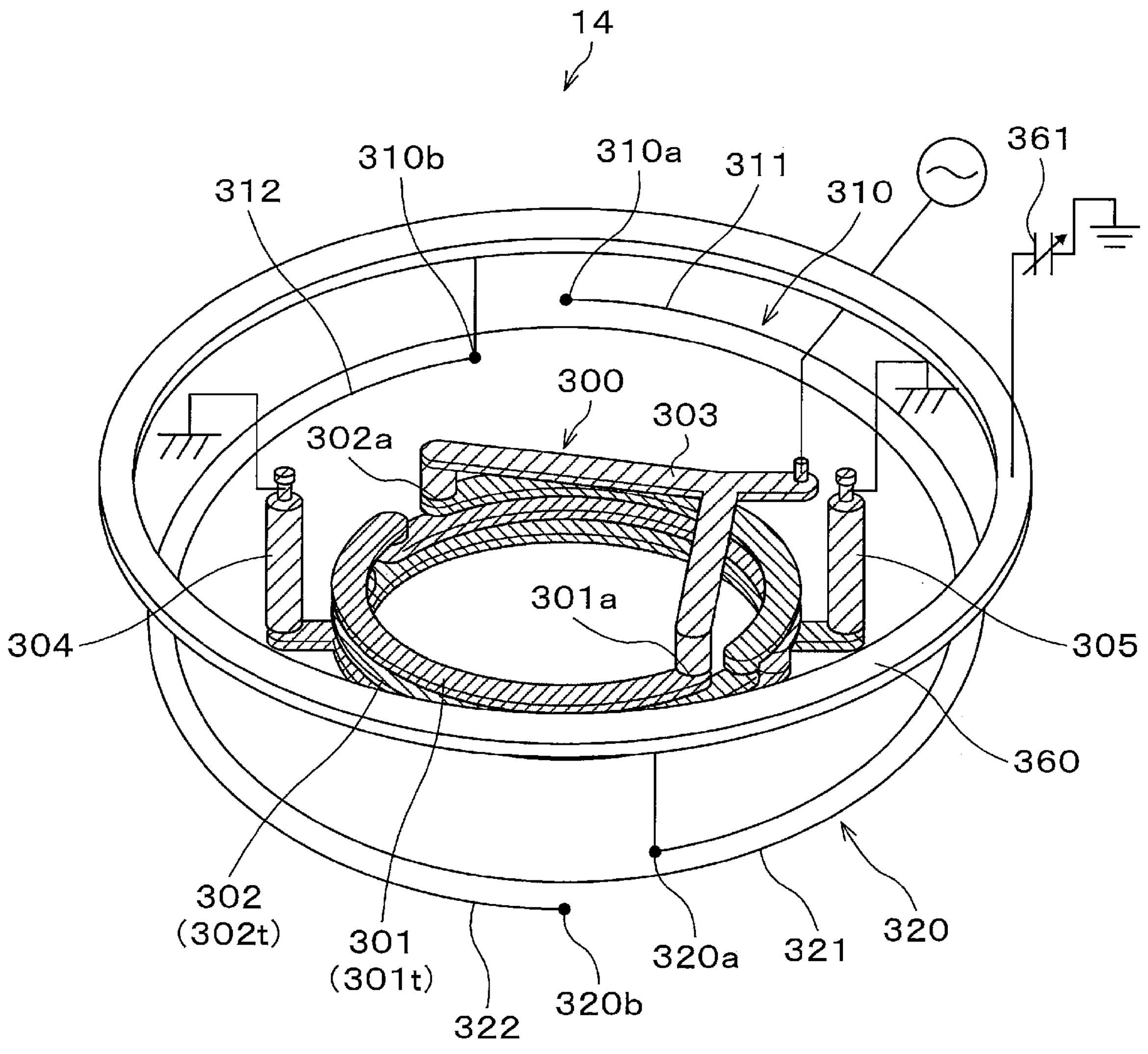
FIG. 20 is a perspective view illustrating an outline of an antenna configuration according to a sixth example of another embodiment.

In the sixth example, as illustrated in FIG. 20, at least one sub-coil includes a first sub-coil 310 and a second sub-coil 320. As in the fifth example, the first sub-coil 310 has a first terminal 310*a* and a second terminal 310*b*, and the second sub-coil 320 has a third terminal 320*a* and a fourth terminal 320*b*. Further, as in the fifth example, the first terminal 310*a* and the fourth terminal 320*b* are open ends, and the second terminal 310*b* and the third terminal 320*a* are arranged symmetrically.

The second terminal 310*b* and the third terminal 320*a* are each connected to a conductive plate 360. The conductive plate 360 has a substantially annular shape in a plan view. The central axis of the outer shape of the conductive plate 360 coincides with the Z axis and is arranged coaxially with the main coil assembly 300. The conductive plate 360 is connected to the ground potential via a capacitor 361. The capacitor 361 is a variable capacitor.

In the sixth example, the same effect as in the fifth example may be enjoyed. Further, since the number of expensive variable capacitors may be reduced, the equipment cost may be reduced.

In the first to sixth examples of the above-described embodiment, the main coil assembly 300 may be connected to the first RF generator of the RF power supply via a conductive plate. Hereinafter, as illustrated in FIG. 21, descriptions will be made on the case where the conductive plate 370 is provided in the first example, but the same applies to the second to fifth examples.

Figure 21:
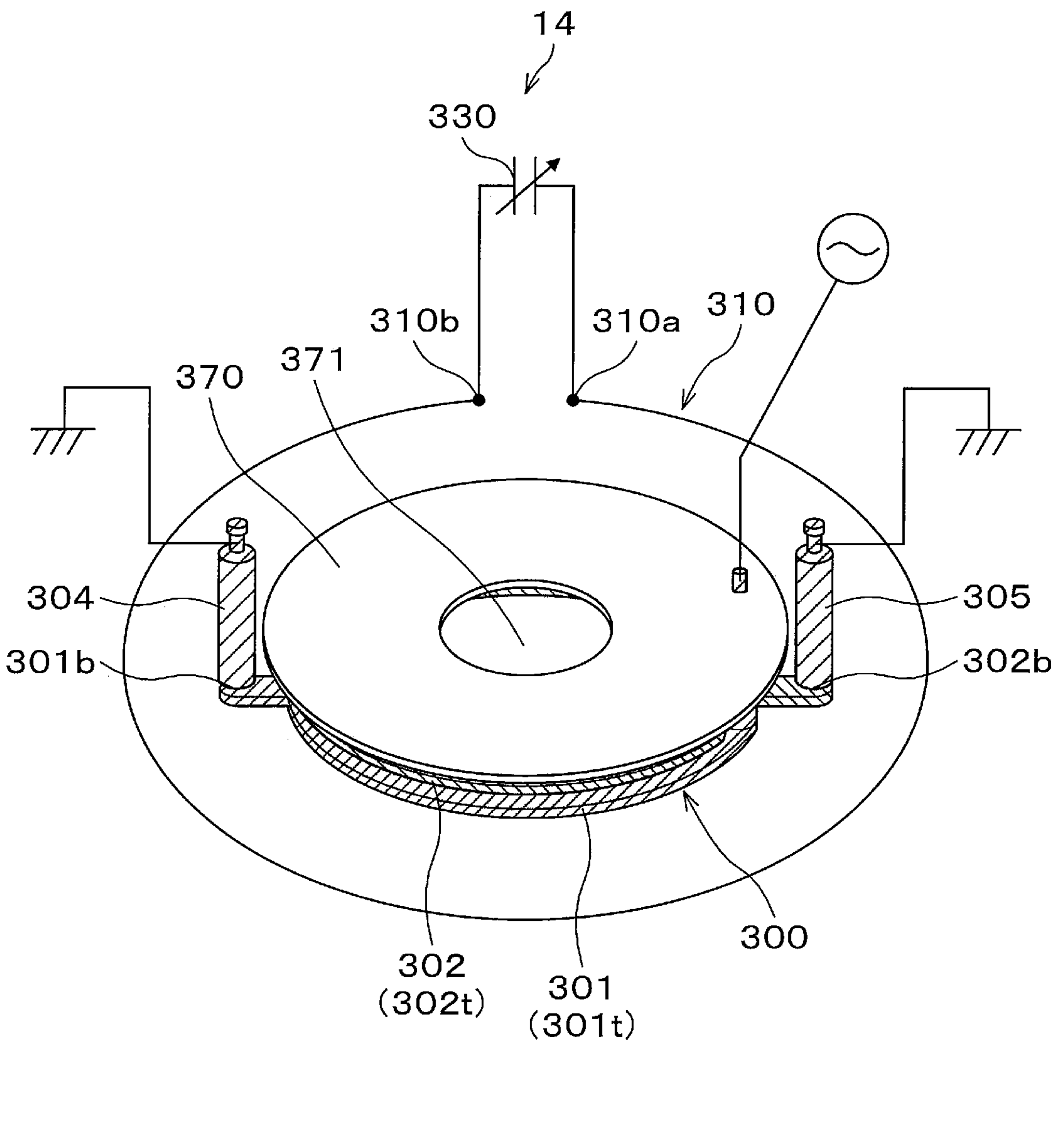
FIG. 21 is a perspective view illustrating an outline of an antenna configuration according to still another embodiment.

As illustrated in FIG. 21, the connecting member 303 of the main coil assembly 300 is connected to the first RF generator of the RF power supply via a conductive plate 370. The conductive plate 370 is arranged around a central gas injection unit so as to surround the substantially cylindrical central gas injection unit in the gas introduction unit 13. The conductive plate 370 has a substantially circular shape in a plan view, and a central opening 371 is formed. The shape of the conductive plate 370 is not particularly limited, and may be, for example, a rectangular shape.

In such a case, when the RF power is supplied from the first RF generator, a current flows in the circumferential direction in the conductive plate 370. Therefore, the circumferential uniformity of the magnetic field strength may be further improved.

Yet Another Embodiment

Figure 22:
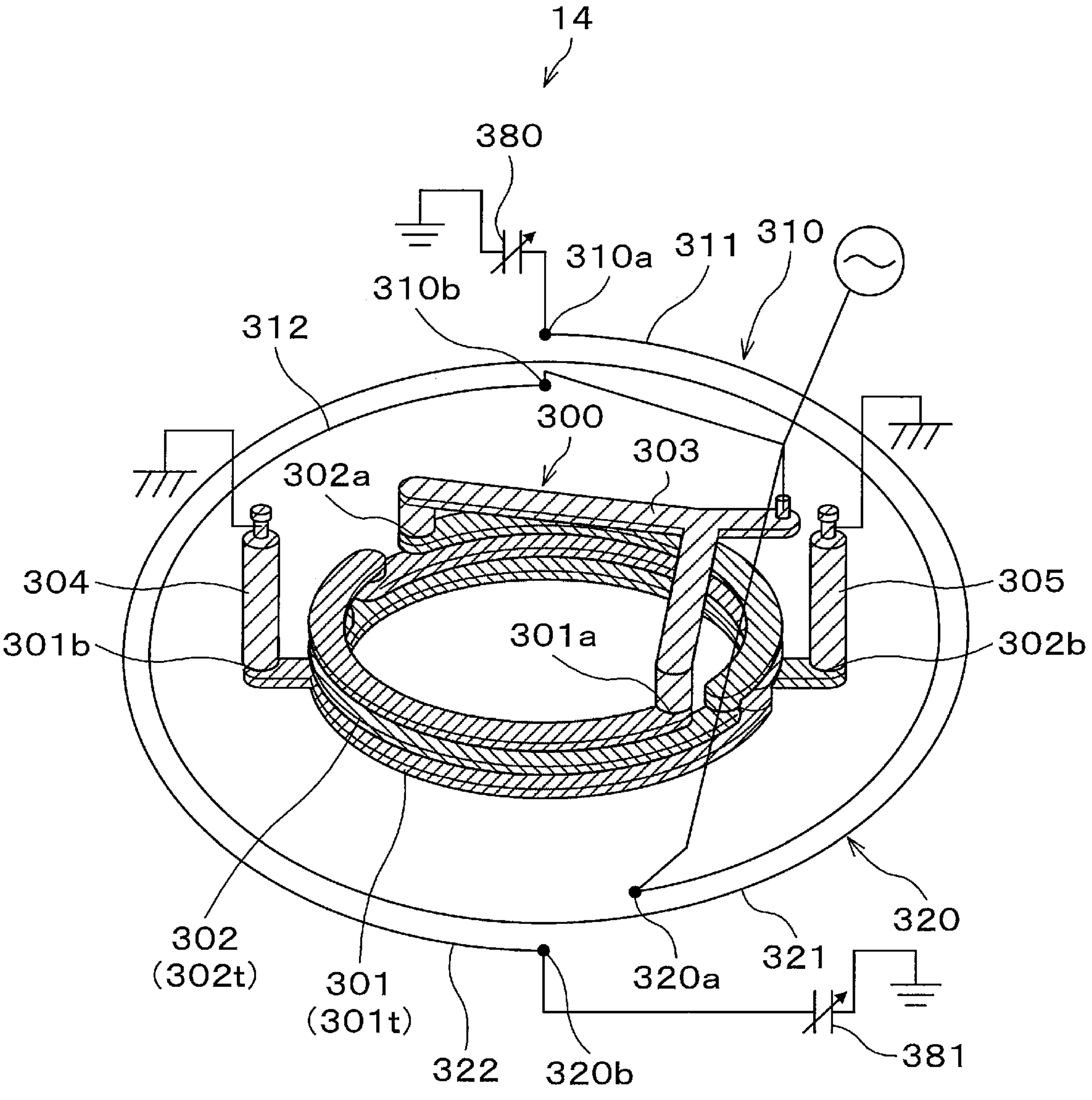
FIG. 22 is a perspective view illustrating an outline of an antenna configuration according to yet another embodiment.

Next, the configuration of the antenna 14 according to yet another embodiment will be described. In the plasma processing apparatus 1 of the above-described embodiment, the main coil 200 or the main coil assembly 300 is connected to the RF potential, and the sub-coil assembly 210 or the sub-coils 310 and 320 are connected to the ground potential. In other embodiments, both the main coil assembly and the sub-coil are connected to the RF potential. FIG. 22 is a perspective view illustrating an outline of the configuration of the antenna 14 according to yet another embodiment.

As illustrated in FIG. 22, the antenna 14 is an antenna assembly having a main coil assembly 300, a first sub-coil 310, and the second sub-coil 320. The main coil assembly 300 has the same configuration as the main coil assembly 300 of the first to sixth examples of the above-described embodiment. As in the third example, the first sub-coil 310 has a first terminal 310*a* and a second terminal 310*b*, and the second sub-coil 320 has a third terminal 320*a* and a fourth terminal 320*b*. Further, as in the third example, the first terminal 310*a* and the second terminal 310*b*, and the third terminal 320*a* and the fourth terminal 320*b* are arranged symmetrically.

In the first sub-coil 310, the first terminal 310*a* is connected to the ground potential via a capacitor 380. The capacitor 380 is a variable capacitor. Further, the second terminal 310*b* is connected to the first RF generator of the RF power supply. In the second sub-coil 320, the third terminal 320*a* is connected to the first RF generator of the RF power supply. Further, the fourth terminal 320*b* is connected to the ground potential via a capacitor 381. The capacitor 381 is a variable capacitor. The first RF generator to which the second terminal 310*b* and the third terminal 320*a* are connected is common to the first RF generator to which the connecting member 303 of the main coil assembly 300 is connected. Further, the first terminal 310*a* and the fourth terminal 320*b* may be connected to a common conductive plate (not illustrated) and connected to the ground potential via a common capacitor (not illustrated).

In such a case, the first sub-coil 310 and the second sub-coil 320 are not inductively coupled to the main coil assembly 300. Then, the RF power is supplied to the main coil assembly 300 to allow a current to flow, and the RF power is also supplied to the first sub-coil 310 and the second sub-coil 320 to allow a current to flow.

In the present embodiment, the main coil assembly 300, the first sub-coil 310, and the second sub-coil 320 are connected to a common RF power supply, but may be connected to separate RF power supplies.

According to the present disclosure, it is possible to improve the uniformity of the plasma distribution with respect to a substrate while reducing the electric field strength when performing plasma processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
- a plasma processing chamber;
- a main coil disposed on or above the plasma processing chamber;
- an RF power supply configured to supply an RF power to the main coil; and
- a sub-coil assembly disposed radially inside or outside the main coil, the sub-coil assembly being inductively coupled to the main coil without a connection to the RF power supply, the sub-coil assembly including a first spiral coil having one or more turns and a second spiral coil having one or more turns, each turn of the first spiral coil and each turn of the second spiral coil being alternately arranged in a vertical direction, the first spiral coil having a first upper terminal at an upper end of the first spiral coil and a first lower terminal at a lower end of the first spiral coil, the first upper terminal being connected to a ground potential via one or more capacitors, the first lower terminal being connected to the ground potential, the second spiral coil having a second upper terminal at an upper end of the second spiral coil and a second lower terminal at a lower end of the second spiral coil, the second upper terminal being connected to the ground potential via the one or more capacitors, and the second lower terminal being connected to the ground potential.

2. The plasma processing apparatus according to claim 1, wherein the main coil is configured such that both ends of a line constituting the main coil are opened, a power is supplied from the RF power supply to a midpoint of the line or a vicinity of the midpoint, and the main coil is grounded in the vicinity of the midpoint, thereby resonating at ½ wavelength of an RF power supplied from the RF power supply.

3. The plasma processing apparatus according to claim 1, further comprising:
- a gas introducing channel provided in a center of an upper portion of the plasma processing chamber and configured to introduce a processing gas into the plasma processing chamber,
- wherein the sub-coil assembly is disposed between the gas introducing channel and the main coil.

4. The plasma processing apparatus according to claim 1, wherein the one or more capacitors include a variable capacitor.

5. The plasma processing apparatus according to claim 1, wherein the second upper terminal is connected to the ground potential via the one or more capacitors.

6. The plasma processing apparatus according to claim 1, wherein a lower surface of the sub-coil assembly includes a first lower surface portion formed of a lower surface of the first spiral coil and a second lower surface portion formed of a lower surface of the second spiral coil, and the first lower surface portion and the second lower surface portion are arranged symmetrically.

7. The plasma processing apparatus according to claim 1, wherein an upper surface of the sub-coil assembly includes a first upper surface portion formed of an upper surface of the first spiral coil and a second upper surface portion formed of an upper surface of the second spiral coil, and the first upper surface portion and the second upper surface portion are arranged symmetrically.

8. The plasma processing apparatus according to claim 1, wherein a diameter of each turn of the first spiral coil is identical, and a diameter of each turn of the second spiral coil is identical.

9. The plasma processing apparatus according to claim 1, wherein the sub-coil assembly includes a third spiral coil having one or more turns, each turn of the first spiral coil,
- each turn of the second spiral coil, and each turn of the third spiral coil are arranged in an order in the vertical direction,
- the third spiral coil has a third upper terminal at an upper end and a third lower terminal at a lower end,
- the third upper terminal is connected to the ground potential via the one or more capacitors, and the third lower terminal is connected to the ground potential.

10. The plasma processing apparatus according to claim 1, wherein each turn of the first spiral coil and each turn of the second spiral coil are plate-shaped.

11. The plasma processing apparatus according to claim 1, wherein a distance between the turn of the first spiral coil and the turn of the second spiral coil adjacent to each other in the vertical direction is 1 mm to 10 mm.

12. The plasma processing apparatus according to claim 1, wherein a first connector connecting the turns in the first spiral coil extends in the vertical direction, and
- a second connector connecting the turns in the second spiral coil extends in the vertical direction.

13. The plasma processing apparatus according to claim 1, wherein the main coil is not connected to the one or more capacitors.

14. An antenna assembly for use in a plasma processing apparatus, the antenna assembly comprising:
- a main coil having a connection point with an RF power supply and configured to be connected to the RF power supply; and
- a sub-coil assembly disposed radially inside or outside the main coil, the sub-coil assembly being inductively coupled to the main coil without a connection to the RF power supply, the sub-coil assembly including a first spiral coil having one or more turns and a second spiral coil having one or more turns, each turn of the first spiral coil and each turn of the second spiral coil being alternately arranged in a vertical direction, the first spiral coil having a first upper terminal at an upper end of the first spiral coil and a first lower terminal at a lower end of the first spiral coil, the first upper terminal being connected to a ground potential via one or more capacitors, the first lower terminal being connected to the ground potential, the second spiral coil having a second upper terminal at an upper end of the second spiral coil and a second lower terminal at a lower end of the second spiral coil, the second upper terminal being connected to the ground potential via the one or more capacitors, and the second lower terminal being connected to the ground potential, wherein the sub-coil assembly is configured to not be directly connected to the RF power supply.

15. The antenna assembly according to claim 14, wherein the one or more capacitors include a variable capacitor.

16. The antenna assembly according to claim 14, wherein the second upper terminal is connected to the ground potential via the one or more capacitors.

17. The antenna assembly according to claim 14, wherein a lower surface of the sub-coil assembly includes a first lower surface portion formed of a lower surface of the first spiral coil and a second lower surface portion formed of a lower surface of the second spiral coil, and the first lower surface portion and the second lower surface portion are arranged symmetrically.

18. The antenna assembly according to claim 14, wherein the main coil is not connected to the one or more capacitors.

19. The antenna assembly according to claim 14, wherein each turn of the first spiral coil and each turn of the second spiral coil are plate-shape.

* * * * *